(12) United States Patent
Stewart et al.

(10) Patent No.: US 7,927,469 B2
(45) Date of Patent: **\*Apr. 19, 2011**

(54) ELECTRO-CHEMICAL PROCESSOR

(75) Inventors: Nigel Stewart, Burwell (GB); Daniel J. Woodruff, Kalispell, MT (US); Paul R. McHugh, Kalispell, MT (US); Gregory J. Wilson, Kalispell, MT (US); Kyle M. Hanson, Kalispell, MT (US); Erik Lund, Bellevue, WA (US); Steven L. Peace, Whitefish, MT (US)

(73) Assignee: Semitool, Inc., Kalispell, MT (US)

( * ) Notice: Subject to any disclaimer, the term of this patent is extended or adjusted under 35 U.S.C. 154(b) by 1272 days.

This patent is subject to a terminal disclaimer.

(21) Appl. No.: 11/467,232

(22) Filed: Aug. 25, 2006

(65) Prior Publication Data

US 2008/0048306 A1 Feb. 28, 2008

(51) Int. Cl.
*C25F 7/00* (2006.01)
(52) U.S. Cl. ............ 204/275.1; 204/242; 205/640; 205/686
(58) Field of Classification Search .......... 205/640, 205/686; 204/242, 275.1
See application file for complete search history.

(56) References Cited

U.S. PATENT DOCUMENTS

| | | | |
|---|---|---|---|
| 5,335,012 A | | 8/1994 | Lisec |
| 5,376,241 A | * | 12/1994 | Shor et al. ............ 205/645 |
| 6,252,203 B1 | * | 6/2001 | Zapata et al. ............ 219/405 |
| 6,585,875 B1 | * | 7/2003 | Ryabkov ............ 205/87 |
| 6,726,815 B1 | * | 4/2004 | Artmann et al. ............ 204/267 |
| 7,153,195 B2 | * | 12/2006 | Lee et al. ............ 451/28 |
| 2003/0132118 A1 | | 7/2003 | Kovarsky |
| 2004/0134787 A1 | | 7/2004 | Pedersen et al. |

OTHER PUBLICATIONS

United States Patent And Trademark Office, International Search Report and Written Opinion for PCT/US07/71474, mailed Aug. 6, 2008.
Lehmann, Volker, "Electrochemistry of Silicon," Dec. 31, 2002, pp. 5-22, Wiley-VCH Verlag GmvH, Weinheim Germany.

* cited by examiner

*Primary Examiner* — Alexa D. Neckel
*Assistant Examiner* — Nicholas A. Smith
(74) *Attorney, Agent, or Firm* — Kenneth H. Ohriner; Perkins Coie LLP

(57) ABSTRACT

A processor for making porous silicon or processing other substrates has first and second chamber assemblies. The first and second chamber assemblies include first and second seals for sealing against a wafer, and first and second electrodes, respectively. The second seal is moveable towards and away from a wafer in the processor, to move between a wafer load/unload position, and a wafer process position. The second electrode may move with the second seal. A light source shines light onto the first side of the wafer. The processor may be pivotable from a substantially horizontal orientation, for loading and unloading a wafer, to a substantially vertical orientation, for processing a wafer.

18 Claims, 17 Drawing Sheets

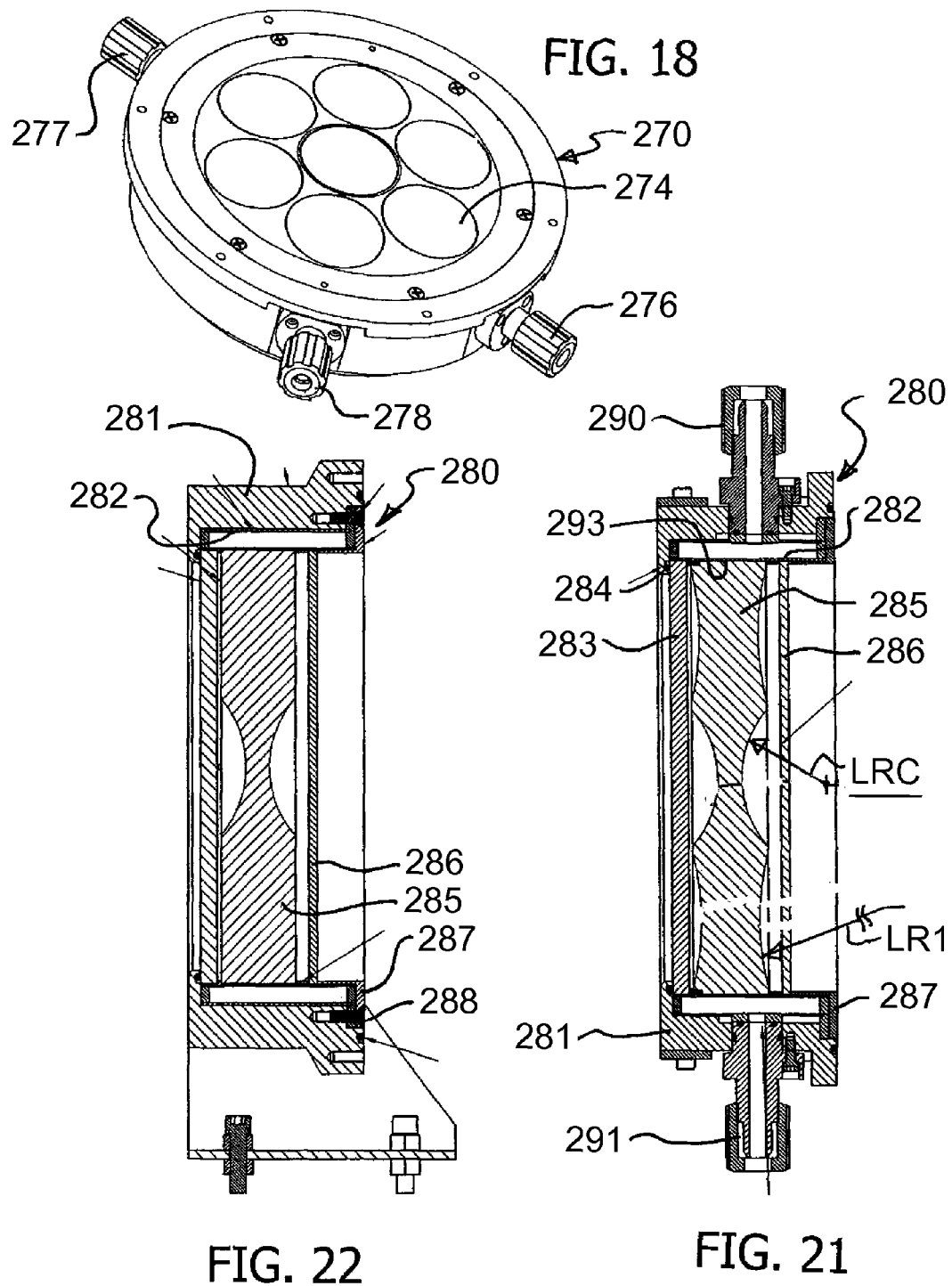

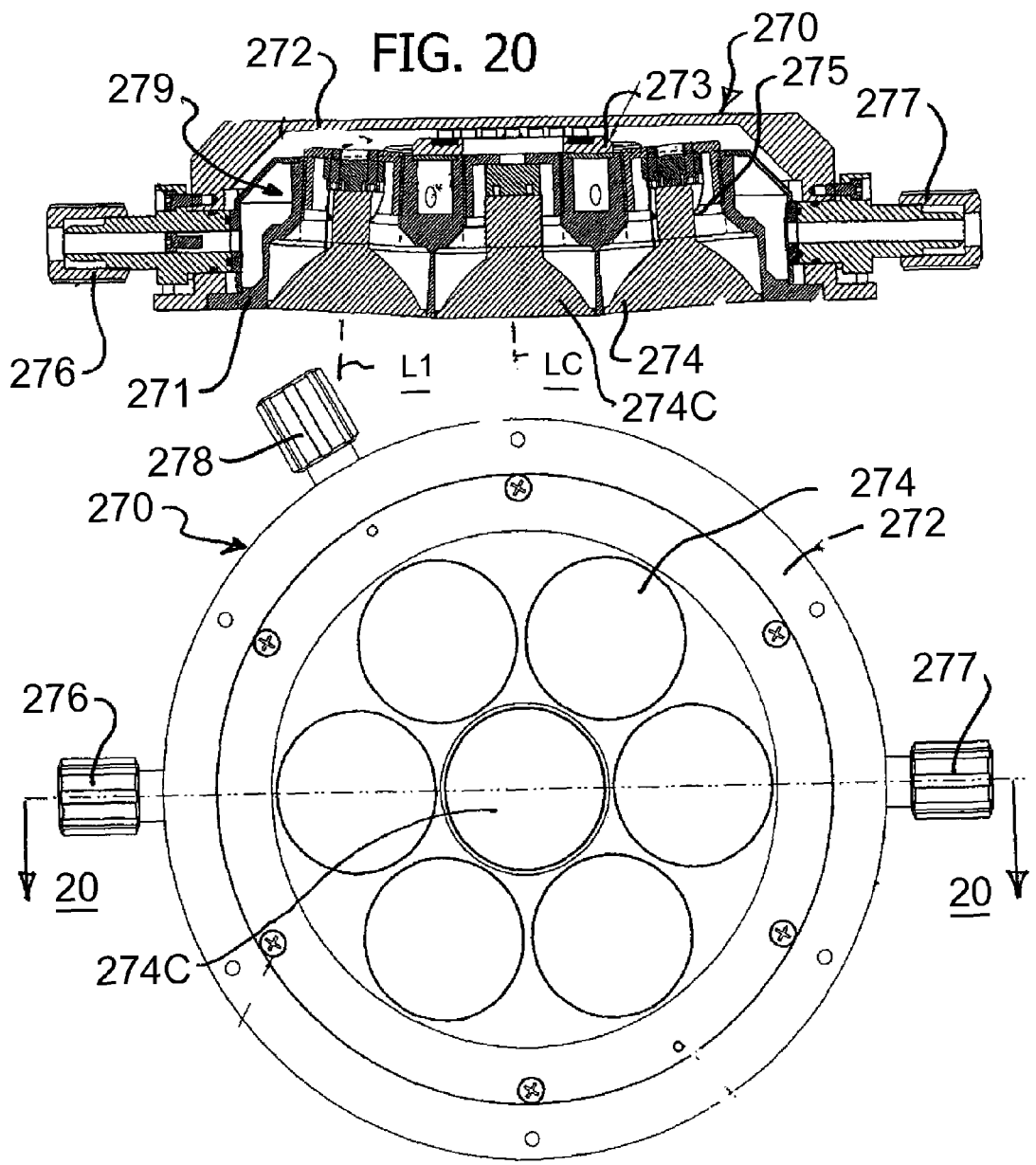

ELECTRO-CHEMICAL PROCESSOR

BACKGROUND

Silicon is the basic building block material of most microelectronic devices. Other micro-scale devices such as micro electro-mechanical devices (MEMs), and micro-optic devices, are also generally made of silicon. These devices are used in virtually all modern electronic products. The raw silicon material used in making these types of microscopic devices is ordinarily provided in the form of thin flat polished wafers.

Porous silicon is a form of silicon having tiny openings or pores. These pores can absorb and emit light. This allows porous silicon devices to interact with light and electronic devices in many useful ways. Porous silicon also has a very large surface area and acts as a strong adsorbent. These properties make porous silicon useful in mass spectrometry, micro-fluidic devices, sensors, fuel cell electrodes, optical, chemical and mechanical filters, biochips and biosensors, fuses for airbags, and various other products.

The porous silicon material itself may also be used as a porous and/or solvable substrate, for example in diagnostic or therapeutic products. Accordingly, porous silicon is increasingly becoming an important material in a wide range of products and technologies.

Porous silicon is generally manufactured in an electro-chemical etching process. A silicon wafer is typically exposed to an electrolyte including concentrated hydrofluoric acid (HF). The electrolyte on one side of the wafer is sealed off from the electrolyte on the other side of the wafer. Electrical current is passed through the electrolyte on each side, making one side the cathode and the other side the anode. Porous silicon may be formed by starting with p-type or n-type silicon, and then forming porous silicon in an electro-chemical process.

Although various types of porous silicon machines or processors have been used to make porous silicon, disadvantages remain in performance, reliability, speed, and other design parameters. HF is highly corrosive and toxic. Accordingly, it must be carefully contained within the processor. Since HF will react with virtually all metals, metals cannot effectively be used in areas of the processor that may come into contact with HF. Moreover, even the smallest of amount of interaction between the HF in the electrolyte and metal can contaminate the wafer. Producing high quality porous silicon requires spatially uniform formation across the wafer, and a spatially uniform electrical current flow through the electrolyte. Achieving uniform current flow is affected by the design of the processor and may be difficult to achieve. In addition, variations in processing between sequentially processed wafers, should be minimal.

Some porous silicon processors require illumination of the wafer, creating still further design challenges. In these processors, highly uniform and very bright lighting is desired to achieve high quality porous silicon. Uniform current flow is also a significant factor. However, the size, shape and location of an anode electrode designed for uniform current flow may interfere with the lighting, especially in a compact processor design. Accordingly, achieving both uniform lighting and uniform current flow in a porous silicon wafer processor may be difficult.

Existing illuminated porous silicon processors generally use large, high power tungsten halogen lamps, or similar types of lamps. Typically, these lamps are positioned relatively far from the wafer. As a result, they tend to illuminate not only the wafer, but also a large area around the wafer. Consequently, they may consume excessive electrical power and generate excessive heat. Excessive heat may be disadvantageous, as it can affect the process liquid, which often includes a solvent such as isopropyl alcohol. Powering the lamps using the low voltages generally associate with solvent containing process liquids can create other design problems as well.

Existing processors have offered only varying results in the face of these engineering design challenges. In view of these factors, improved methods, processors and systems for making porous silicon are needed.

SUMMARY

A novel processor has now been invented providing various improvements in making porous silicon or in similar electro-chemical processing. This new processor provides highly uniform processing. Potential for contamination of wafers before, during, and after processing is significantly reduced. Potential for corrosion of processor components is similarly largely avoided, offering long term reliability and performance, and reduced maintenance requirements. The processor is also adaptable for use in an automated processing system, providing relatively rapid processing. In one aspect, this new processor may have first and second seals and first and second electrodes. The second seal can be moveable relative to first seal, for loading and unloading a workpiece. Typically, the second electrode will move with the second seal. One or more lamps may be positioned to shine light through an open central area of the first electrode, towards a workpiece between the first and second seals. This design provides a processor offering very good performance in a compact space. In another respect, seal rinsing capability and control of electrical current and electrolyte makeup may be used to provide more uniform wafer-to-wafer processing.

The invention resides as well in methods for processing, and in sub-combinations of the elements and steps described.

BRIEF DESCRIPTION OF THE DRAWINGS

In the drawings, wherein the same reference number indicates the same element, in each of the views:

FIG. 18 is a front perspective view of the lamp assembly shown in FIGS. 9-11.

FIG. 19 is a front view of the lamp assembly shown in FIG. 18.

FIG. 20 is a section view taken along line 20-20 of FIG. 19.

FIG. 21 is a section view taken along line 21-21 of FIG. 9.

FIG. 22 is a section taken along a line rotated about 30 degrees from line 21-21 in FIG. 9.

DETAILED DESCRIPTION OF THE DRAWINGS

Figure 1:
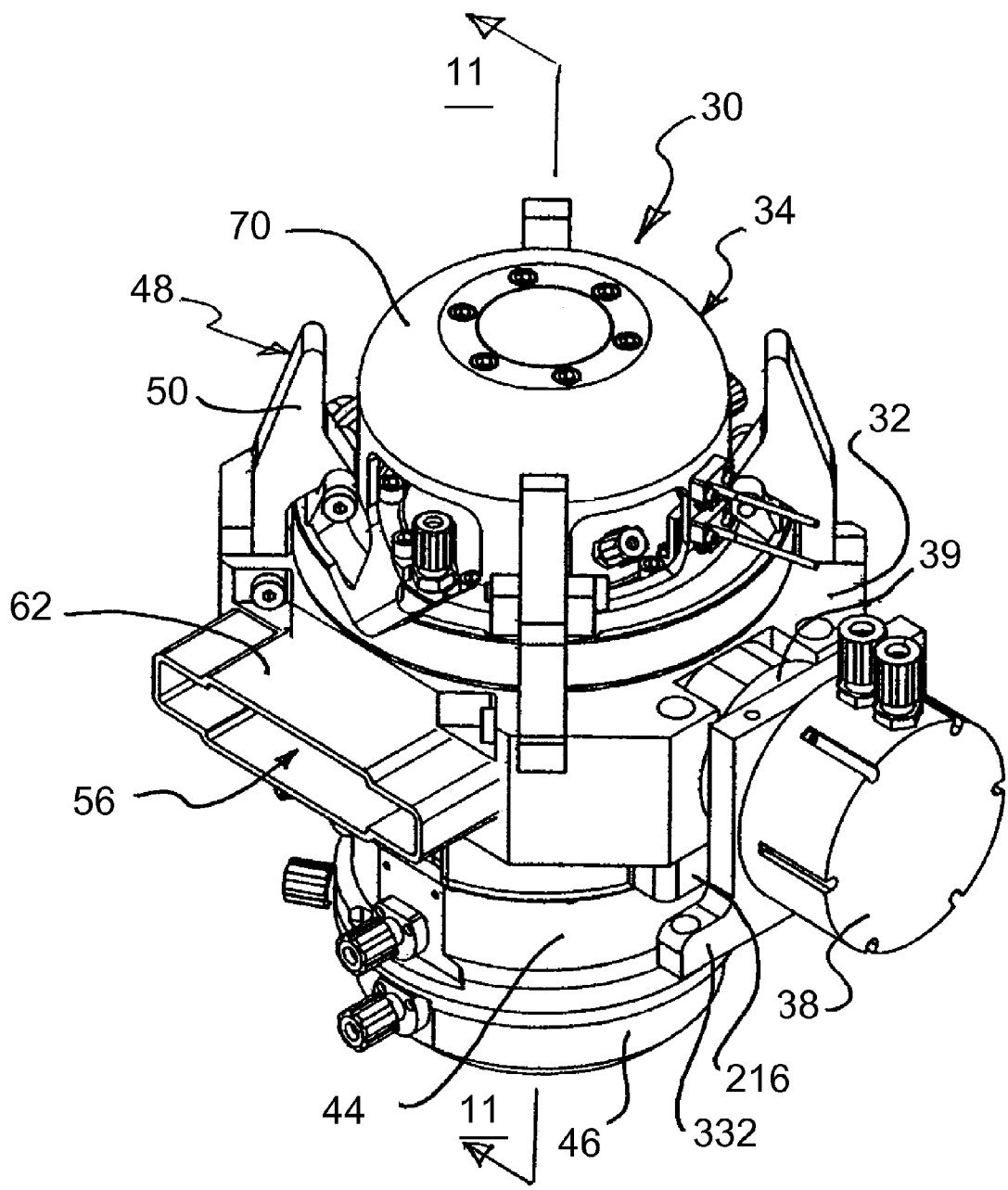
FIG. 1 is a top and front perspective view of a porous silicon processor.
Figure 2:
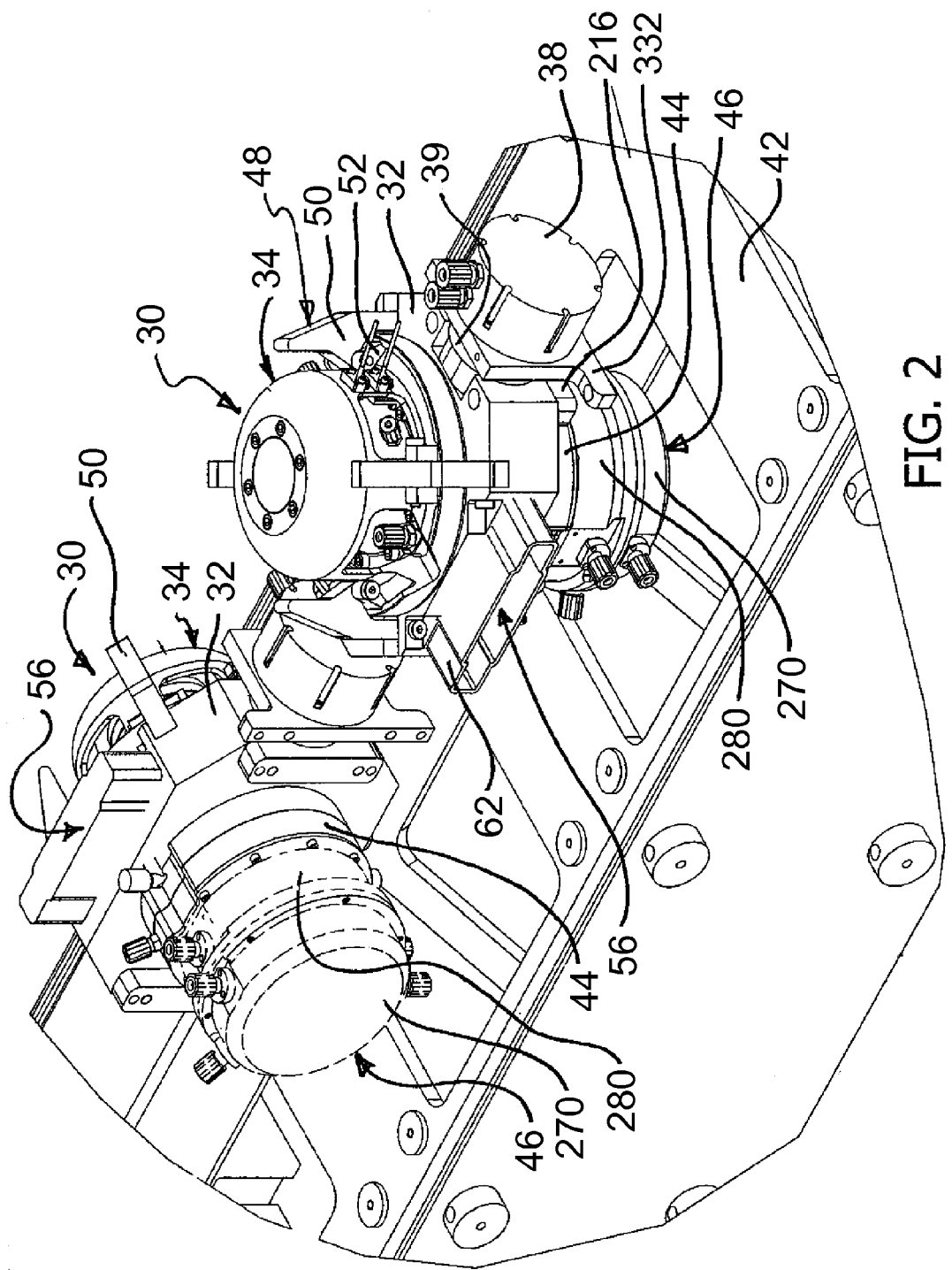
FIG. 2 is a top and front perspective view of two of the processors shown in FIG. 1 provided in a processing system. The processor on the right is in a load/unload position. The processor on the left is in a process position.
Figure 3:
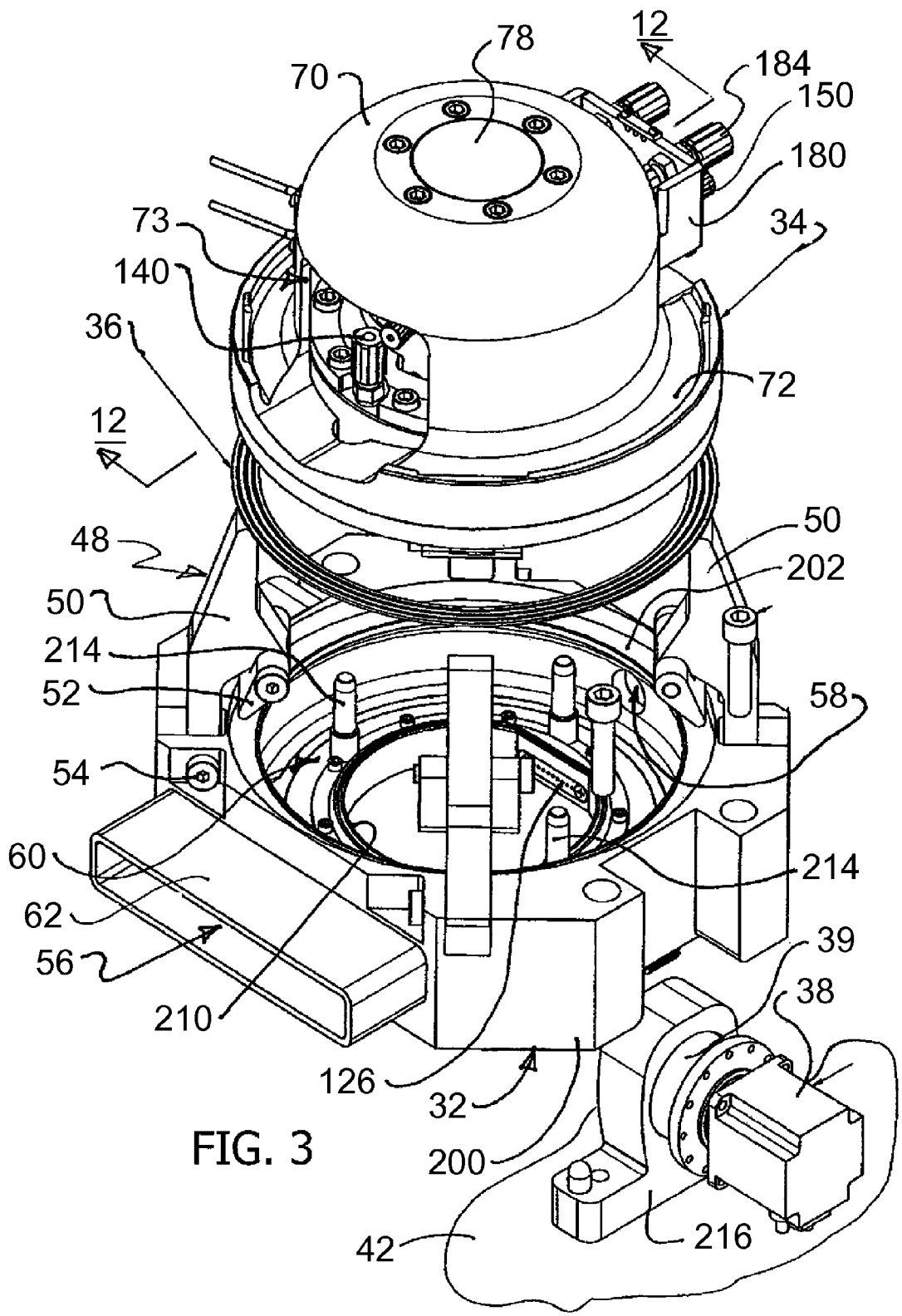
FIG. 3 is an exploded top and front perspective view of the head and base of the processor shown in FIGS. 1 and 2.

Turning now in detail to the drawings, as shown in FIG. 1-3, a head 34 is attached onto a top or first side of a base 32. An anode assembly 44 is attached to the bottom or second side of the base 32. An illumination module 46 is shown here attached to the anode assembly 44. The head 34, base 32, anode assembly 44 and the illumination module 46 form an electro-chemical processor 30. Referring to FIGS. 1 and 2, a motor or other actuator, such as a rotate motor 38, can pivot the entire processor 30. The processor 30 on the right side in FIG. 2 is shown in an upright or load/unload position. The processor 30 on the left side in FIG. 2 is pivoted about ¼ turn into a process position.

A retainer generally designated 48 in FIGS. 1-3 is provided on the head 34 and/or the base 32 for holding them together. Various forms of retainer 48 may be used. In a basic form, the retainer 48 may simply be bolts or other fasteners holding the head onto the base. FIGS. 1-3 show another form of retainer 48 having four spaced apart cam handles 50 pivotably attached to the base 32 via pivot bolts 54, and with a cam latch 52 pivotably attached onto each cam handle 50. When engaged or locked, the cam handles 50 securely seal the head 34 to the base 32, as shown in FIG. 1. The cam handles 50 may be quickly released (by pulling radially outwardly), to allow the head 34 to be separated from the base 32, for system set up, inspection, or maintenance.

Figure 11:
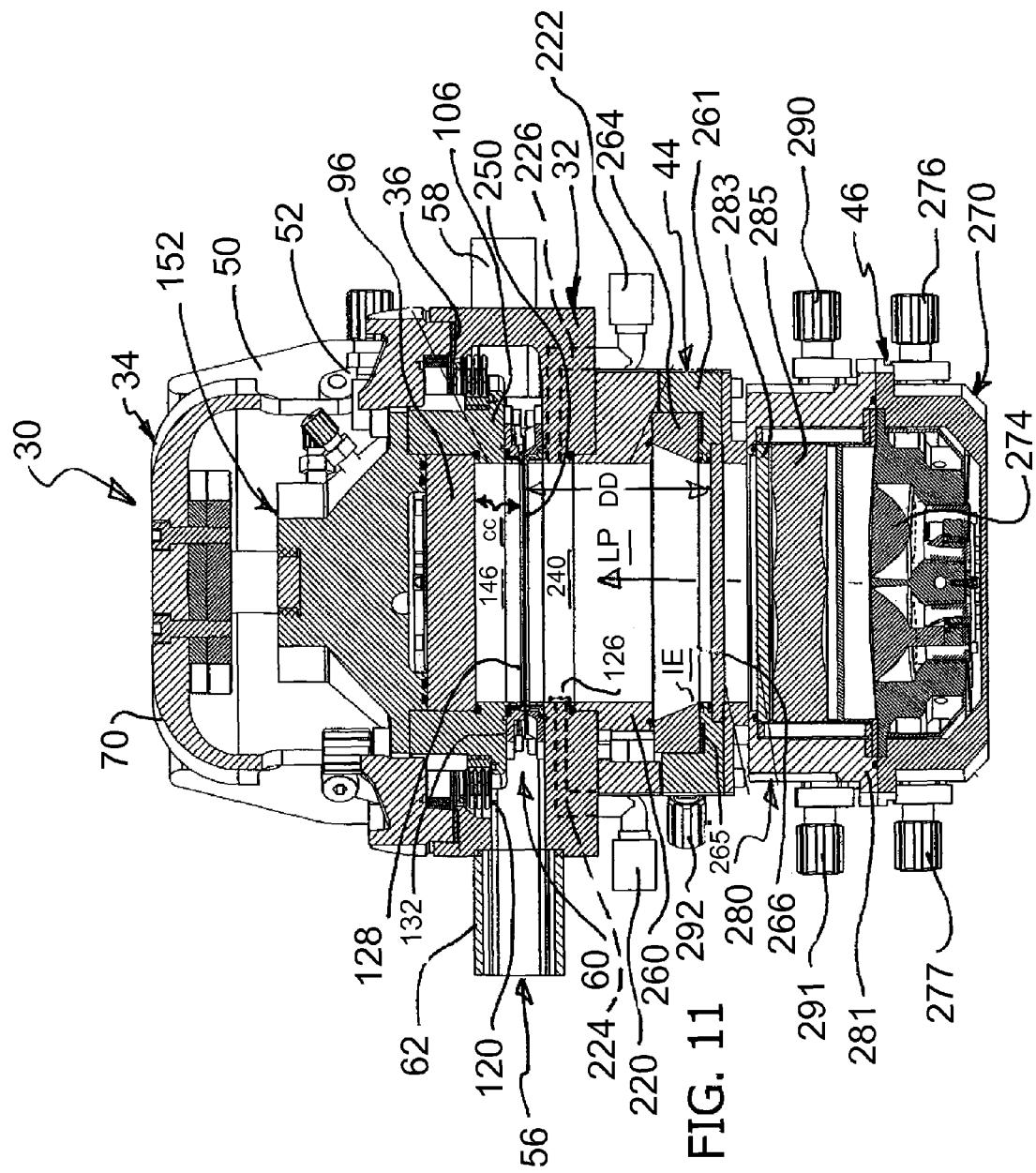
FIG. 11 is a section view taken along line 11-11 of FIG. 1.

Referring momentarily to FIG. 11, the head 34 and the base 32 may form a containment chamber 60, with an upper or cathode process chamber 146 and a lower or anode process chamber 240 within the containment chamber 60. Returning now to FIGS. 1-3, a wafer load/unload opening or slot 56 extends into the base 32, to allow a wafer to be moved through the containment chamber 60 to the process chambers 146 and 240. A containment drain and gas/vapor exhaust 58 may be provided in the base 32, generally opposite from the load slot 56. A frame 62 may surround the load slot 56 at the front of the processor 30.

For electro-chemical processing, the processor 30 is provided with two electrodes and two process chamber seals. At least one process chamber seal is moveable. An electrode may move with the moveable process seal. The moveable seal may be in the head 34 or in the base 32. The other electrode and process chamber seal, may be fixed or moving, and typically are fixed in place within the processor 30. The drawings show an example of the processor 30 where the moving electrode and seal is in a head, and a fixed electrode and seal is in a base, positioned vertically on top of the base. However, these positions may be reversed, as they are not essential to the invention. Except for the two electrodes, the two process chamber seals, and the a light source such as the illumination module 46, the other specific components described below, including those forming the containment chamber 60, are not necessarily essential and may be omitted, or substituted out in place of an equivalent functional element.

Figure 12:
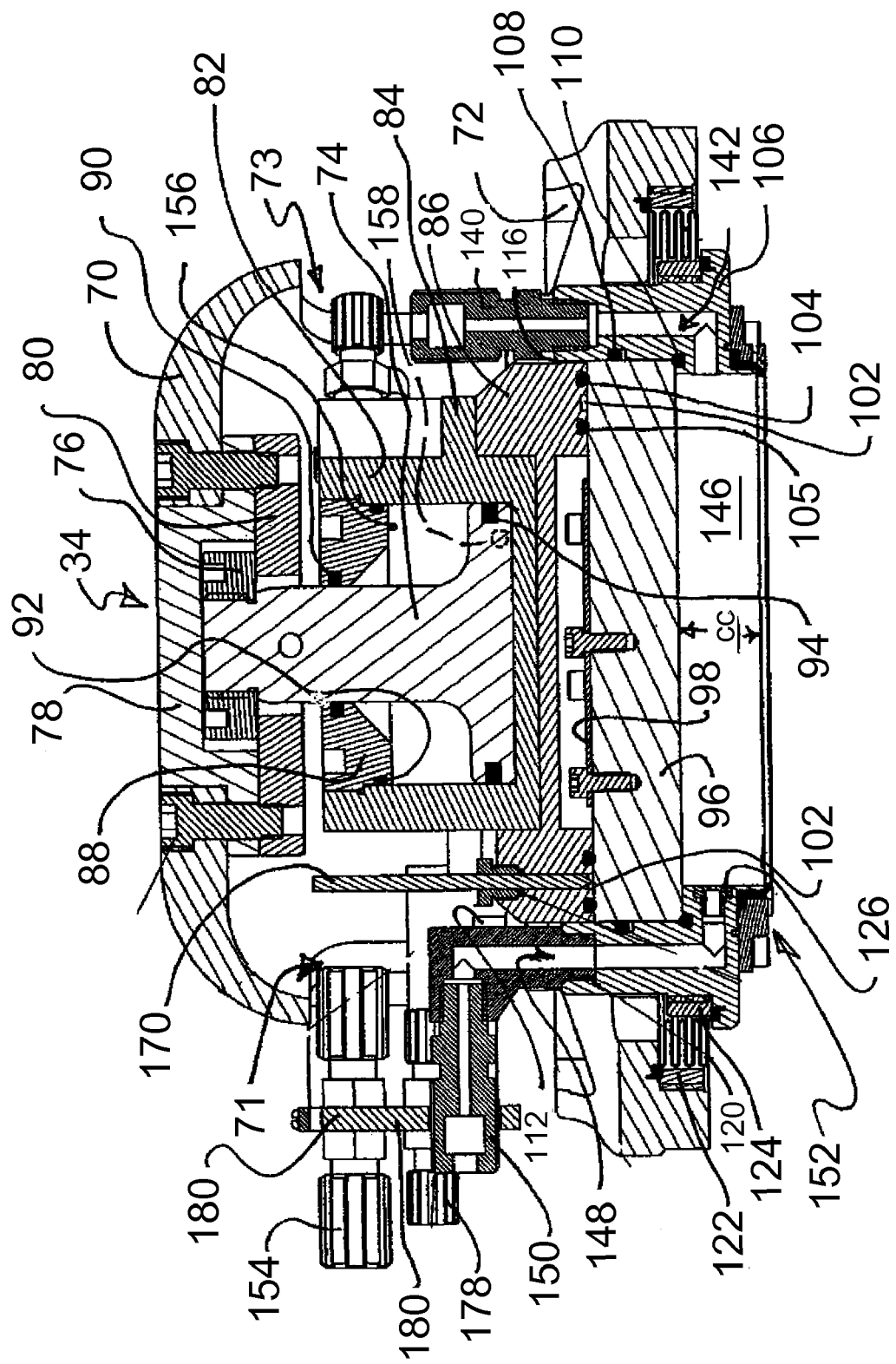
FIG. 12 is a section view taken along line 12-12 of FIG. 3 and showing the head alone.
Figure 13:
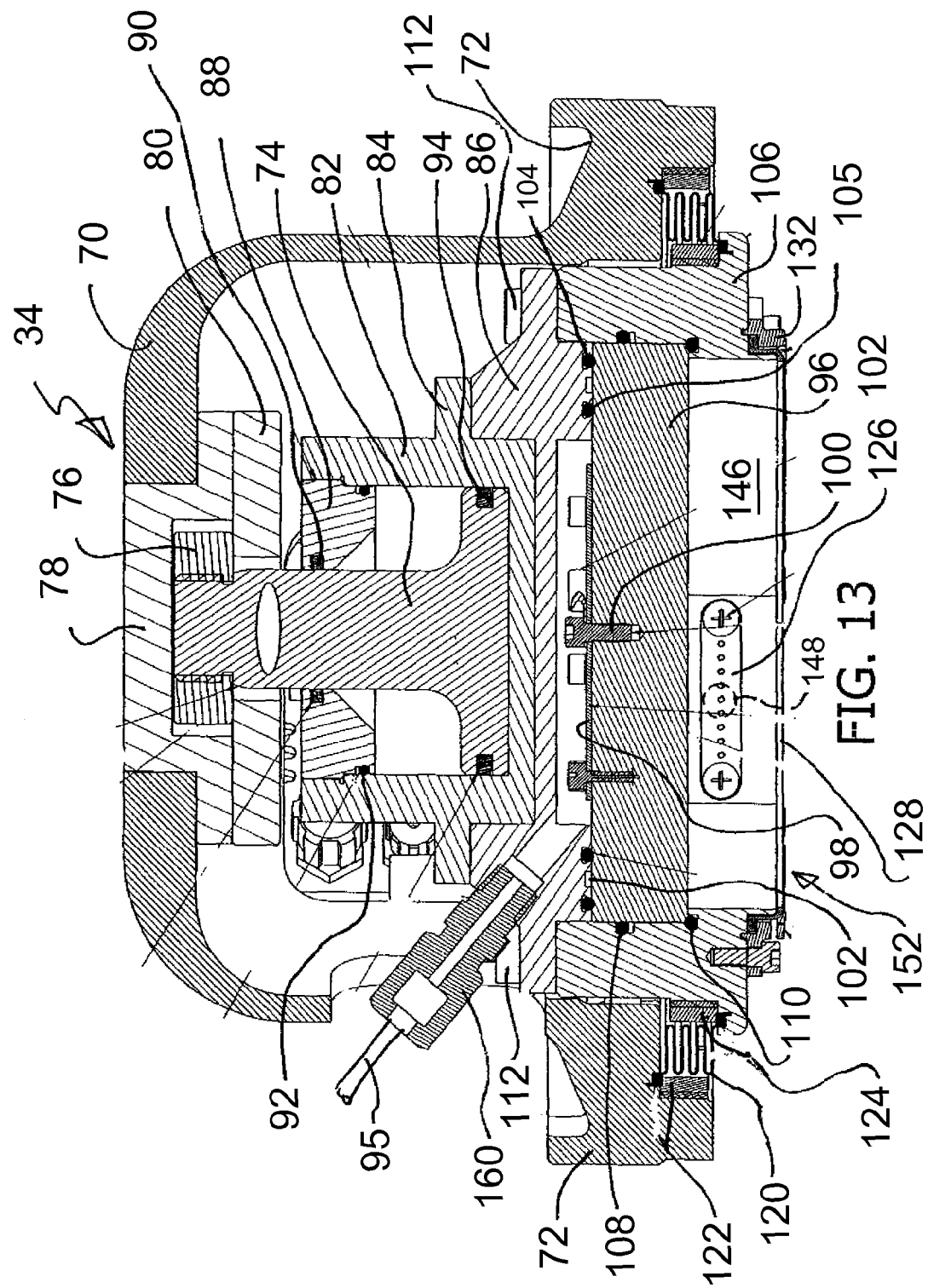
FIG. 13 is a section view taken along line 13-13 of FIG. 4 and also showing the head cover.

The specific mechanism or force selected to move the moveable seal is also not essential. This movement may be provided by hydraulic, pneumatic, electric, gas or steam pressure, or mechanical forces. In the design shown, hydraulic force is used, with water as the hydraulic fluid. In this example of a hydraulically driven processor, as shown in FIGS. 12 and 13, a piston cap 78 is attached to the head cover 70. A piston 74 is fixed in position relative to the cover 70 by a piston nut 76 and a piston plate 80. A cylinder 82 is supported around the piston 74, with the lower end of the piston 74 sealed against the interior cylinder walls by a piston seal 94. A piston ring 88 is attached to the upper end of the cylinder 82. An inner piston ring seal 90 seals the piston ring 88 against the piston 74. An outer piston ring seal 92 seals the piston ring 88 against the cylinder 82. For clarity of illustration, fluid and electrical lines and cables are generally omitted from the drawings.

Referring still to FIGS. 12 and 13, a cylinder ring 86 is attached to an annular flange 84 of the cylinder 82. An electrode ring 106 is in turn attached to an annular flange of the cylinder ring 86 via cap screws 112. An upper or first electrode 96 (in this case, the cathode) is held in place between the electrode ring 106 and the cylinder ring 86. The electrode 96 is sealed against the electrode ring 106 by first and second seals 110 and 108 at the front surface and cylindrical side of the electrode 96. A third seal 104 and a fourth seal 105 seal the back surface of the electrode 96 against the cylinder ring 86. An annular groove 102 is positioned between the third seal 104 and the fourth seal 105 for improved leak detection, as described below. An electrode lead or wire 95 runs through an electrical fitting 160 on the cylinder ring 86 and is attached to a buss plate 98 via a cap screw 100. Since metal components may cause contamination if they come into contact with certain process liquids, the back side of the electrode 96 is well sealed from process liquids. Consequently, metal cap screws may be used to secure the metal buss plate onto the back surface of the electrode 96. Typically, multiple cap screws are used to secure the buss plate to the electrode, in a geometric pattern, since the number and location of the screws may affect the uniformity of current flow through the electrode, and ultimately affect current uniformity at the wafer.

Figure 14:
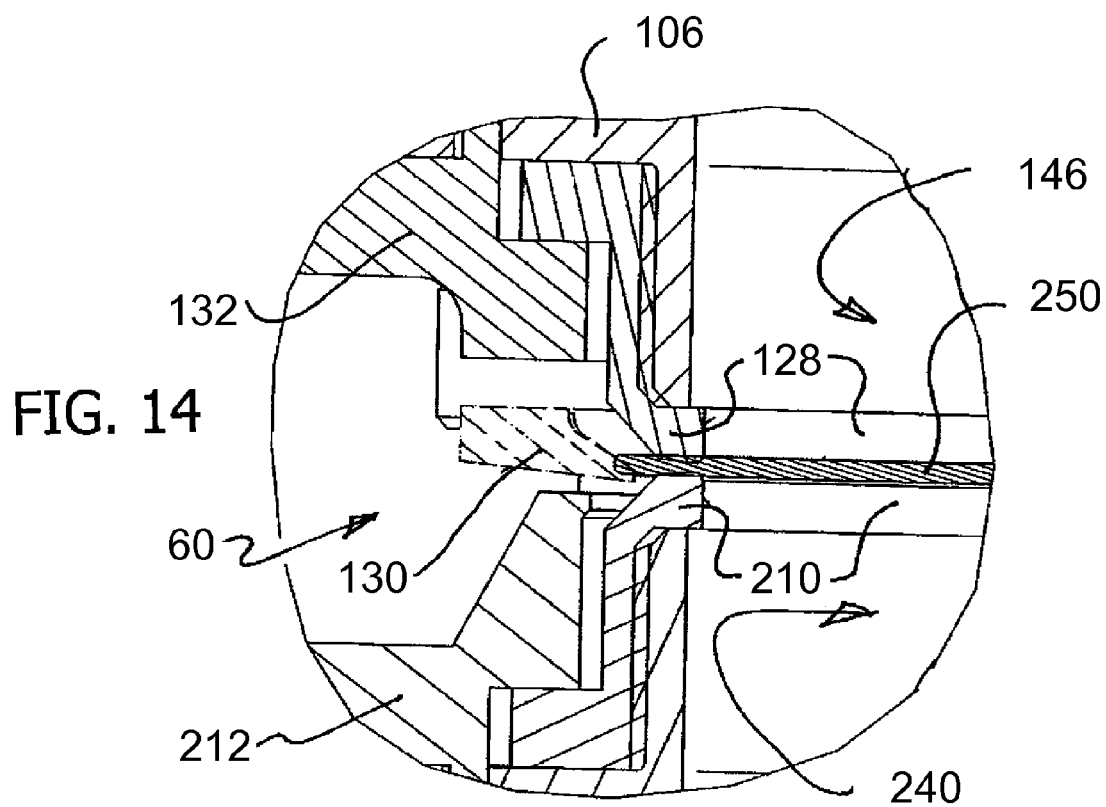
FIG. 14 is an enlarged section view of the seals and ejector tab shown in FIG. 5.
Figure 15:
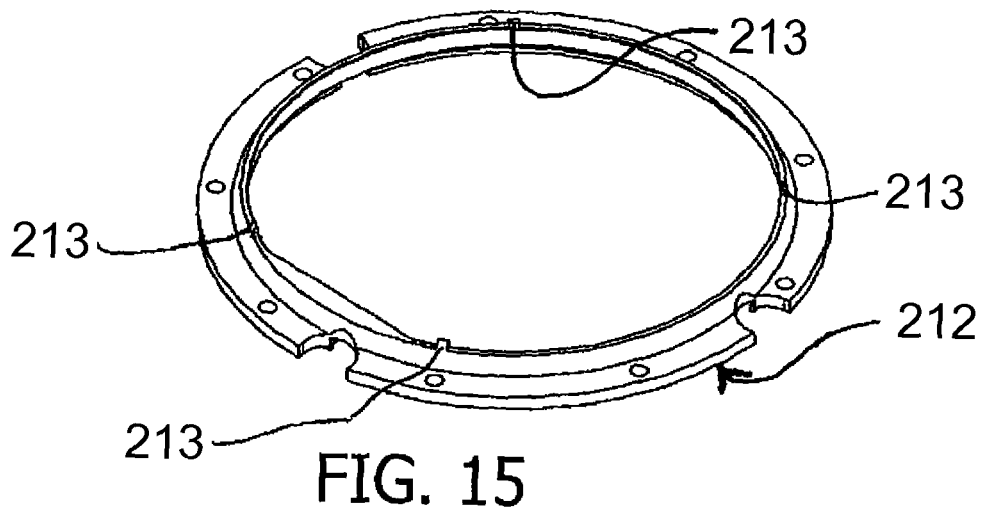
FIG. 15 is a perspective view of the lower seal retainer shown in FIG. 14.

Referring now to FIGS. 11-14, a head seal 128 is attached to the bottom surface of the electrode ring 106 via an upper seal clamp ring 132. The cylindrical open space shown in FIG. 11 as CC between the electrode 96 and the plane of the head seal 128 forms an upper process chamber 146 when the seal 128 is in contact with a wafer 250, as shown in FIGS. 11 and 14. As best shown in FIG. 13, the upper end of a bellows 120 is attached to the underside of an annular cam ring 72 on the cover 70 by an upper bellows retainer ring 122. The lower end of the bellows 120 is attached to a lip on the electrode ring 106 via a lower bellows retainer ring 124. As a result, upon actuation of the cylinder 82, a moveable electrode assembly generally designated as 152, and including the piston ring 88, cylinder 82, cylinder ring 86, electrode 96, electrode ring 106, and the seal 128, can move vertically relative to the cover 70, as well as to the base 32, with the bellows 120 maintaining a seal between the electrode assembly 152 and the base 32.

Referring now FIG. 12, an electrolyte liquid port or outlet 148 connects from an outlet or recirculation fitting 150 to a duct 148 in the electrode ring 106 that opens into the chamber 146. An electrolyte liquid inlet 142, which may be located opposite from the outlet 148, leads to an electrolyte recirculation or inlet fitting 140. Switching to FIG. 13, a diffuser plate 126 having multiple small openings is positioned over the duct 148 in the upper process chamber 146. As shown in FIG. 12, windows or openings 71 and 73 are provided in the side walls of the cover 70, to provide clearance for the up and down vertical movement of the fluid and electrical fittings, e.g., the electrical connector 160 and the liquid process chemical recirculation or outlet fitting 150, as the electrode assembly 152 moves up and down.

Referring still to FIG. 12, an optical liquid detector 170 extends through a clamp nut and a seal in the cylinder ring 86, with the tip of the detector 170 positioned within the groove 102. The detector 170 can be connected to a processor controller (such as the controller 304 described below) via fiber optic lines passing through a strain relief feature on the head. The fluid and electrical or optical lines connecting to the head may be made through adapters on connectors on the upper fitting bracket to provide strain relief as the processor 30 moves between load/unload (wafer horizontal) and process (wafer vertical) positions.

As also shown in FIG. 12, an upper seal vent 116 is provided between the second seal 108 and the third seal 104. The vent 116 is designed to reduce wicking of electrolyte inwardly between the back surface of the electrode 96 and the bottom surface of the cylinder ring 86.

Figure 4:
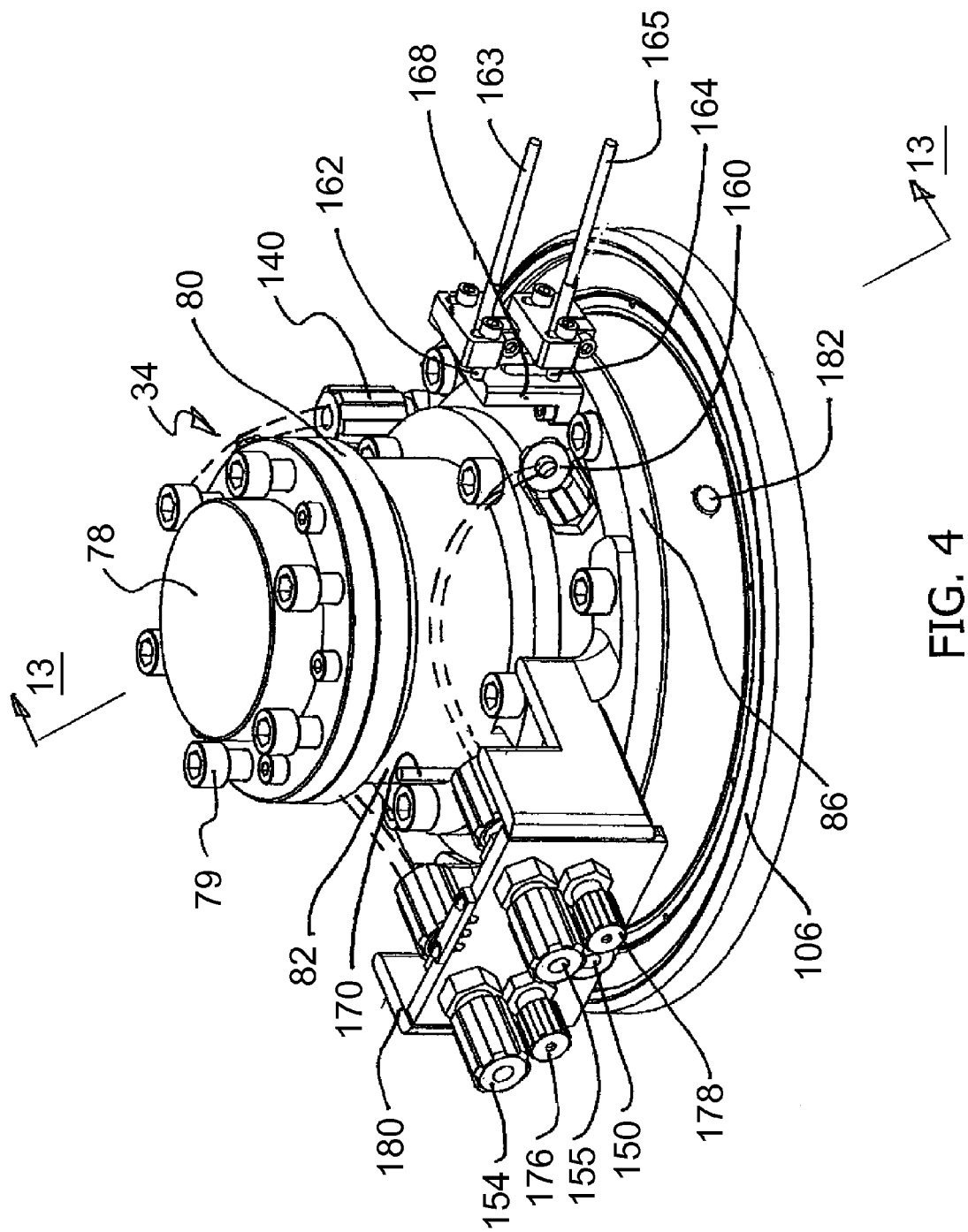
FIG. 4 is a top and front perspective view of the head shown in FIGS. 1 and 3, with the head cover removed for purpose of illustration.
Figure 5:
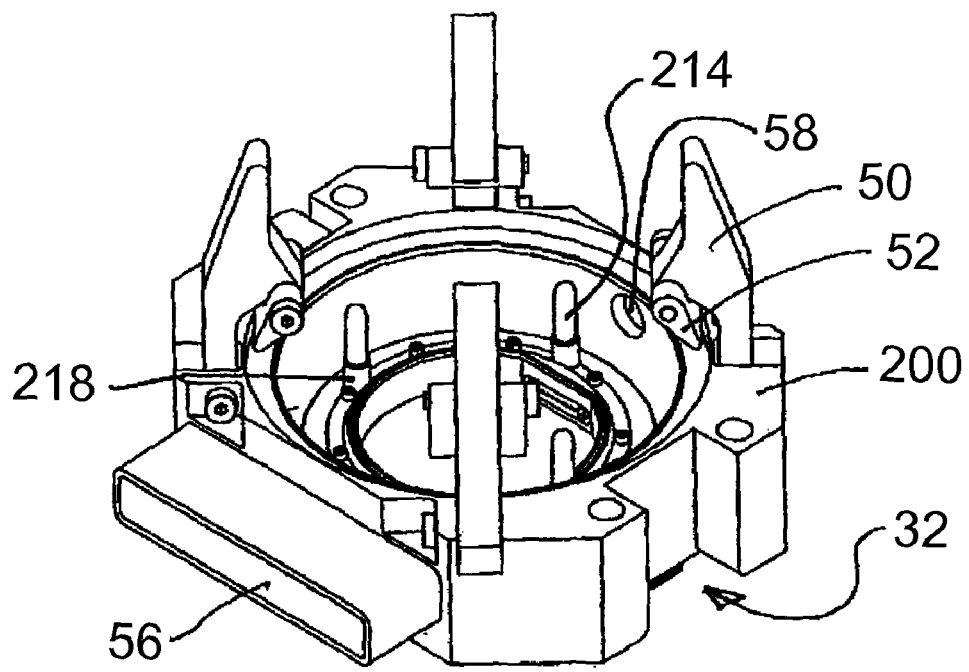
FIG. 5 is a top and front perspective view of the base shown in FIG. 1.

Turning to FIG. 4, an optical flag plate 168 extends up from the cylinder ring 86. Upper and lower optical sensors 162 and 164 are attached to the cover 70, and are also connected via the fiber optic leads 163 and 165 to the processor controller. Strain relief fittings are typically provided on these leads, so that they may better accommodate the movement of the processor. The sensors 162 and 164 detect the position of the flag plate 168, which corresponds to the position of the moveable electrode assembly 152 relative to the base 32. As shown in FIGS. 3, 5 and guide pins 214 in the base 32 extend up and into the bores the electrode ring 106, to maintain the moveable electrode assembly 152 in alignment with the base 32.

FIG. 3 shows the head 34 separated from the base 32. With the head retainer 48 released, in this case by pulling the cam handles 50 outwardly, the head 34 may be separated from the base 32. The electrical and fluid lines connecting to the head may be flexible, so that the head may be removed from the base without the need to break these connections.

FIG. 4 shows the head 34 separated from the base 32, and with the head cover 70 removed, for purpose of illustration. As shown in FIG. 4, an upper fitting bracket 180 and the optical flag plate 168 are attached to the cylinder ring 86. The cap screws 79 which ordinarily attach the piston cap 78 and the piston plate 80 to the cover 70 are shown in their assembled positions, but without the cover 70 in place. The upper optical sensor 162 and the lower optical sensor 164 are attached to the side wall of the cover 70. However, they are shown in FIG. 4 for purpose of illustration only. An alignment pin 182 in the electrode ring 106 may extend into a vertical slot on an inside surface of the head cover 70, to keep the head cover angularly aligned with the movable electrode assembly 152. As shown in FIGS. 4 and 12, cylinder water supply and return lines extend from fittings 176 and 178 on the upper fittings bracket 180 to upper and lower cylinder ports 156 and 158 extending through the walls of the cylinder 82. Alternately supplying water under pressure through the upper and lower cylinder ports 156 and 158 hydraulically moves the moveable electrode assembly 152 between up or open and down or closed positions.

Figure 6:
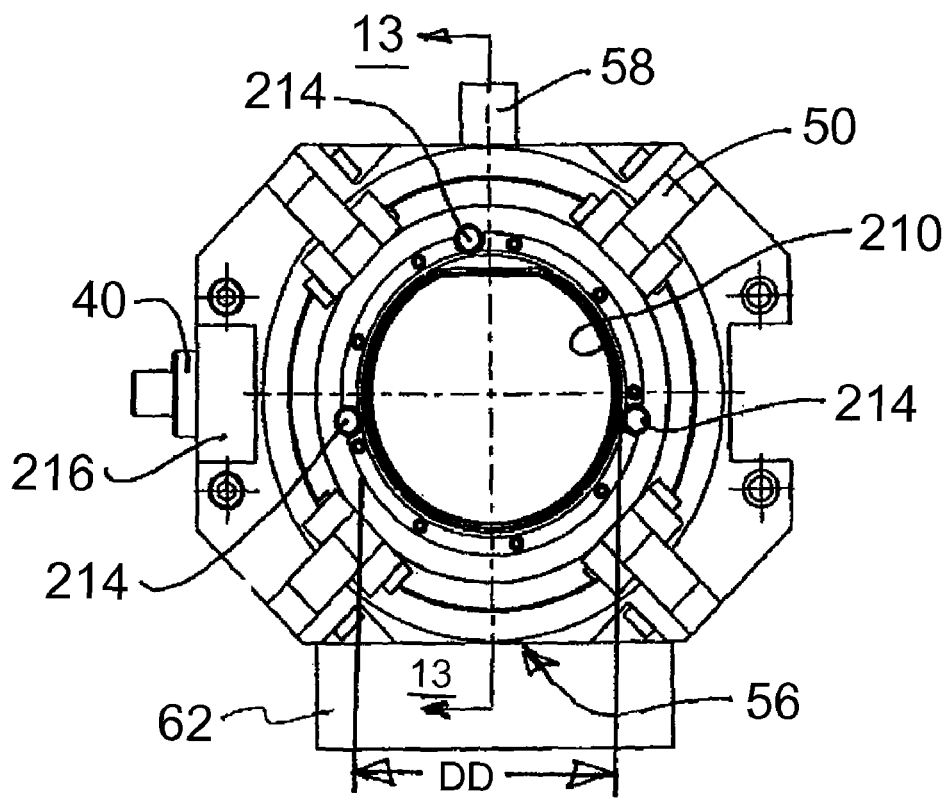
FIG. 6 is a plan view of the base shown in FIG. 5.
Figure 7:
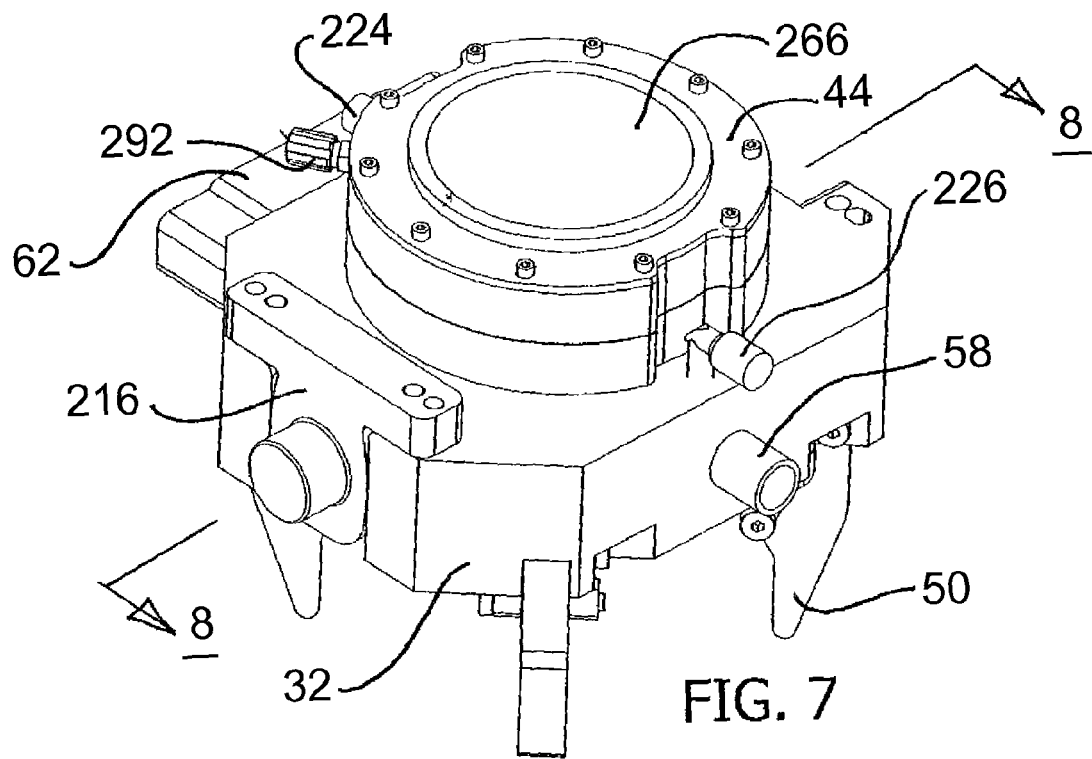
FIG. 7 is bottom perspective view of the base, the anode assembly and the lamp assembly shown in FIG. 1.

As shown in FIGS. 3, 5 and 6, the two front guide pins 214, closest to the load slot 56, are spaced apart by a dimension DD which is nominally larger than the wafer diameter. The third guide pin 214 is located towards the back of the processor 30, closer to the containment drain 58. The guide pins 214 are located on a diameter concentric with and slightly greater than, the diameter of the seal 128. The lower section of each guide pin 214 has a shoulder 218, shown in FIG. 5, which may act as a hard stop to set the spacing between the seals when the processor is closed, thereby also setting a predefined amount of seal compression on the wafer.

Figure 8:
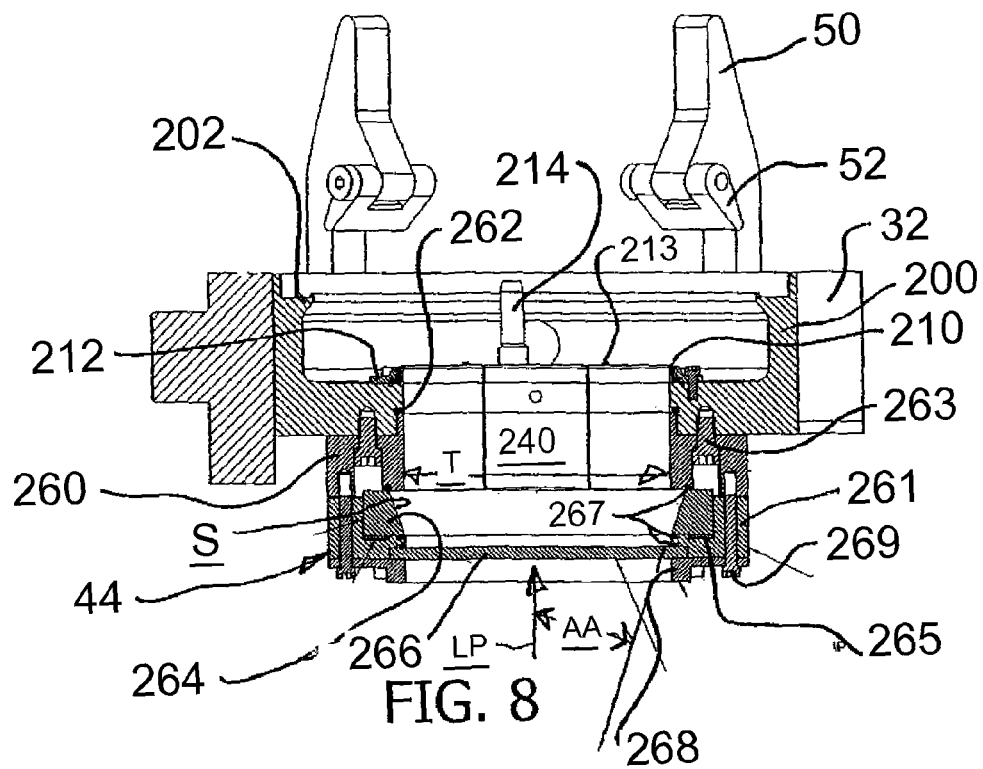
FIG. 8 is a section view taken along line 8-8 of FIG. 7

Referring to FIG. 8, the base 32 has a base ring 200. A seal seat 202 at the upper end of the base ring 200 holds a containment seal 36, which is shown in FIG. 3. The containment seal 36 seals the head 34 to the base 32 and form the containment chamber 60. As shown in FIG. 8, the anode assembly 44 is attached to the side of the base ring 200 opposite from the head 34, e.g., on the bottom of the base 32. A tunnel section 260 of the anode assembly is shown in FIG. 8 attached onto the base ring 200 via screws 263. A tunnel seal 262 seals the upper rim of the tunnel section against the base ring 200. An annular electrode (here an anode) 264 is secured within an anode housing 261. The front or top end of the anode 264, and the back or bottom end of the anode 264, are sealed via anode seals 267 against the bottom of the tunnel section 260 and the anode housing 261, respectively. An electrically conductive ring contact 265 is positioned between the anode 264 and the anode housing 261. An electrical lead or wire (not shown) is connected to the ring contact 265. Electrical current is provided to the lead via the connector 292 shown in FIG. 11. The lower or anode process chamber 240, which is filled with a process chemical liquid during processing, is sealed off from the ring contact 265 by the seals 267.

A window 266 is held in place on, the anode housing 261, by a window clamp ring 268. The window 266 is also sealed against the anode housing 261 via a seal 267. The window clamp ring 268 may be attached to the tunnel section 260 via screws 269. The window may be sapphire. As shown in FIG. 8, the anode 264 is ring-shaped, and may be dimensioned so that all sections of the anode are positioned outside of the dimension of diameter T. Consequently, the anode 264 does not block light path LP extending from the illumination module 46 to the wafer 250.

The anode 264 may have a conically tapered inner surface S, as shown in FIG. 8. The angle AA of the surface S generally ranges from about 10-30° or 15-25°. The angle AA of the surface S may provide more uniform electrical current flow across the electrolyte to the wafer surface. The anode 264 may also be made with straight and perpendicular surfaces, with no angled surface. However, with this design, more current may flow from the electrode surface closest to the wafer, as this would be the least resistive path. The maximum inner diameter of the anode 264 will typically vary with the diameter of the wafer to be processed. The drawings show a processor adapted for processing a 6 inch (150 mm) diameter wafer. However, the processor 30 may of course be scaled up or down for processing other size wafers.

The seals such as seals 262 or 267, as well as various of the other seals shown in the drawings, may be o-rings or similar seals, made of a material compatible with process chemical liquids used in the processor. Although various components of the anode assembly 44, as well as various others, are shown as held together with screws, various other attachment techniques may also be used, such as via adhesives, welding, clamping, fasteners, unitary construction, etc.

Figure 9:
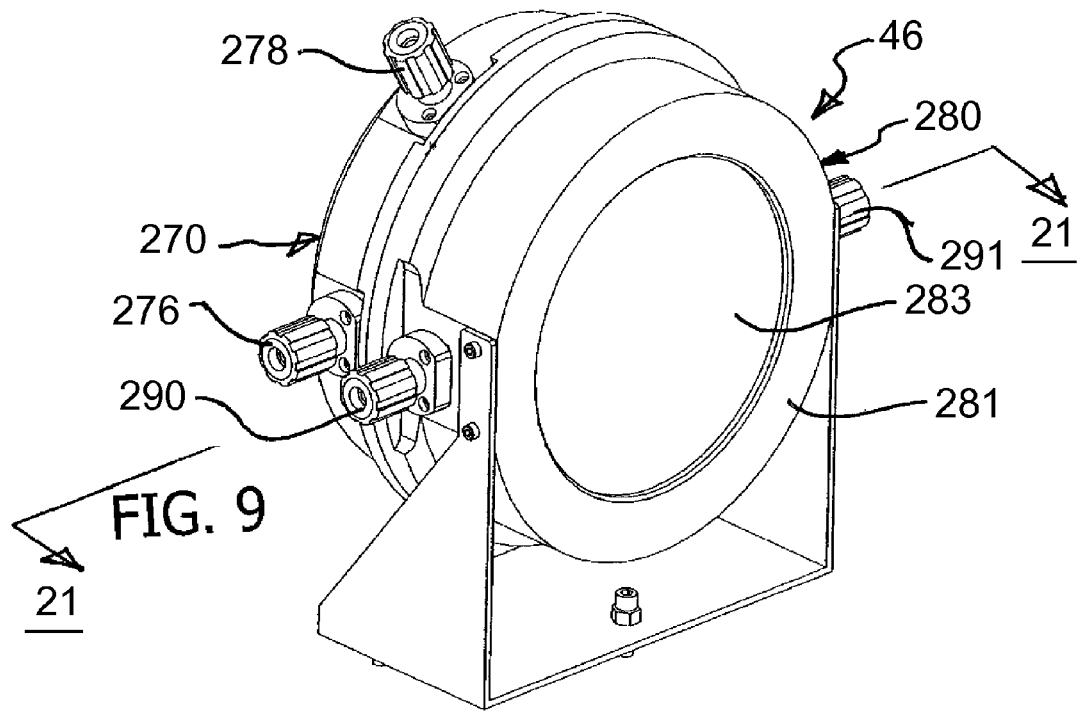
FIG. 9 is a front perspective view of the anode assembly and the lamp assembly shown in FIGS. 1 and 7, with the anode assembly supported on a test stand.
Figure 10:
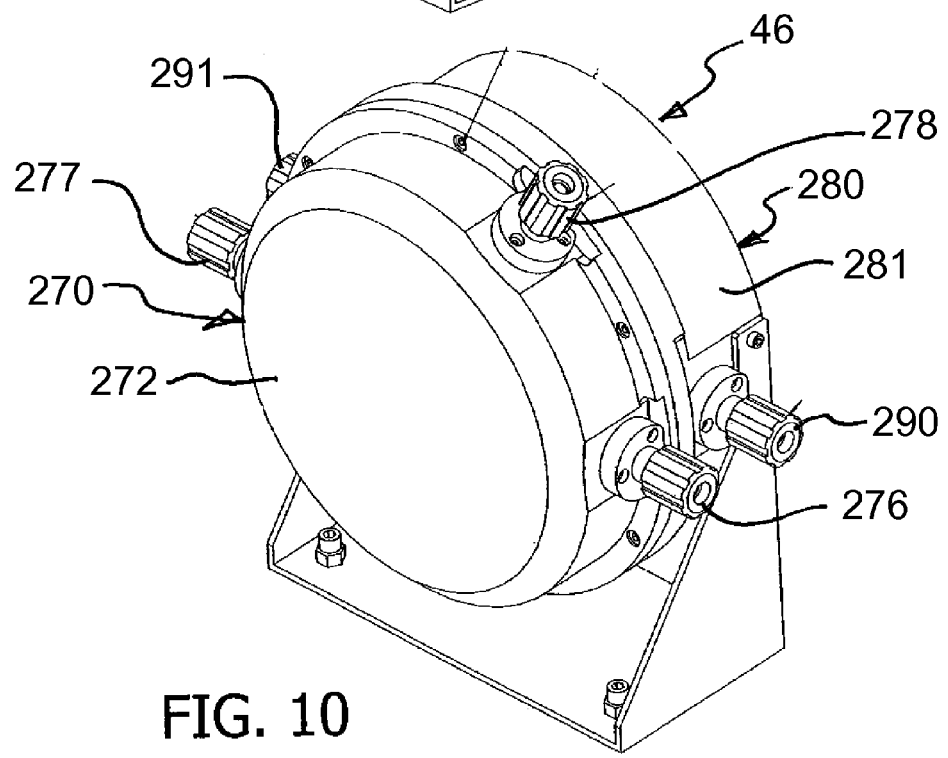
FIG. 10 is a rear perspective view of the anode assembly and the lamp assembly as shown in FIG. 9.

As shown in FIGS. 9-11, the illumination module 46 can be attached to, and may be generally concentric with, the anode assembly 44. The illumination module may be attached to the bottom or back of the anode assembly 44 via mechanical fittings or fasteners. The specific illumination module 46 shown here includes a lamp assembly 270 and a reflector assembly 280. The design details of the lamp assembly and the reflector assembly may be changed with specific applications. The reflector assembly, in some designs, may be omitted. Turning to FIGS. 18-20, the example of the lamp assembly 270 shown in these drawings includes multiple lamps 274 supported in lamp holders 275 on a lamp housing 271. Liquid coolant fittings 276 and 277 connect to a coolant channel 279 formed within the lamp housing, as shown in FIG. 20. Electrical power is provided to the lamps 274 by a cable connecting through an electrical fitting 278 and attached to a pair of semicircular buss bars 273. A housing cover 272 covers the back of the lamp housing 271.

As shown in FIGS. 18 and 19, in this example of a lamp assembly 270, seven lamps or bulbs 274 are used in a symmetrical pattern. Specifically, six lamps are arranged on a circle, generally at 60° intervals, and surrounding a seventh central lamp. The specific lamps 274 shown are 37 watt, 12V, halogen lamps with a 40° spot beam. As shown in FIG. 20, the six lamps 274 around the central lamp 274C are aimed slightly outwardly. The angle between the axes L1 of each surrounding lamp 274, and the axis LC of the central lamp 274C, is about 2-6° or 3-5°. A lamp assembly 270 with this design provides uniform lighting when used with the reflector assembly 280 described below. Other lamp assemblies having varying numbers and configurations of lamps may be used in other processor designs to similarly provide uniform lighting.

Turning to FIGS. 9, 10, 21 and 22, the reflector assembly 280 has a reflector 282 within a reflector cover 281. Liquid coolant fittings 290 and 291 connect into a coolant channel within the reflector 282. A lens 285 is positioned within the reflector cover 281 between a window 283 and a diffuser 286. The inside surfaces 293 of the reflector 282 (facing the lens 285) are highly reflective. The window 283, which may also be sapphire, can be sealed to the cover 281 using a seal element 284. The diffuser may be ground glass or another light diffusing component. A front retaining ring 287 is attached to the reflector cover by screws 288 and secures the diffuser, lens and window in place. Referring to FIG. 21, the lens 285, which is typically also ground glass, has a central radiused area LRC aligned with the central lamp 274C and surrounding radiused areas LR1 aligned with the six surrounding lamps 274. The radius at LRC is about 1.5 inches, and the radius at LR1 is about 4 inches in the lens 285 shown in FIG. 21.

Since the illumination module 46, which includes the lamp assembly 270 and reflector assembly 280, provides light into the processor, the illumination module need not be actually physically attached to the processor 30. Rather, the illumination module 46 may optionally be provided as a separate unit supported on or near the deck 42 or other structure, and not attached to the processor. As shown in dotted lines in FIG. 2, by separating the illumination module 46 from the rest of the processor 30, the length or height of the processor is reduced. The processor 30 then requires less clearance space to pivot between the two positions shown in FIG. 2. In this design, the illumination module may be fixed in place and positioned to shine light through the window 266 of the anode assembly, when the processor is in the process position shown at the left side of FIG. 2. However, to by moving the illumination module 46 to a position closely adjacent to the window 266, after the processor is pivoted into the process position, improved lighting efficiency may be achieved. The illumination module may therefore be supported on a track, swing arm, or other mechanism to move the illumination into a position adjacent to, or even in contact with, the window or the anode assembly, during processing, and then moving the illumination out of the way, to allow the processor to pivot back to the load/unload position shown at the right side of FIG. 2.

As shown in FIG. 8, wafer guides or protrusions 213 extend up slightly from the base seal retainer 212 and help with wafer alignment or positioning, when a wafer is placed onto the base seal 210, as described below. The upper or head seal 128 is generally the same diameter as the base seal 210. Indeed, the head and base seals may be the same. As shown in FIG. 3, the processor 30 may have seals 128 and 210 and other components adapted for processing a wafer having a flat edge. In this case the seals, seal retainers, and the electrodes may be generally D-shaped. For round wafers, these components may be round.

Figure 16:
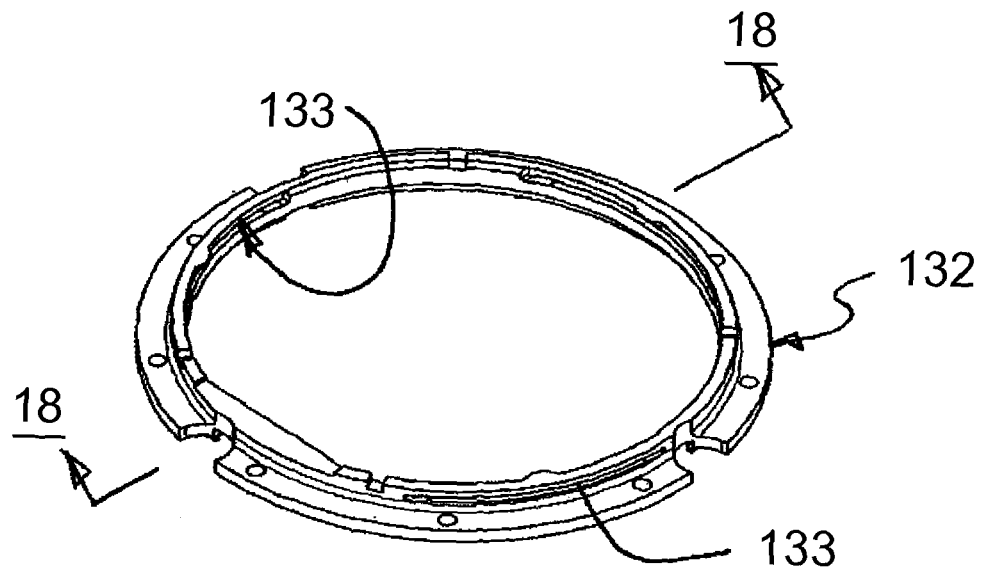
FIG. 16 is a perspective view of the upper seal retainer shown in FIG. 14.
Figure 17:
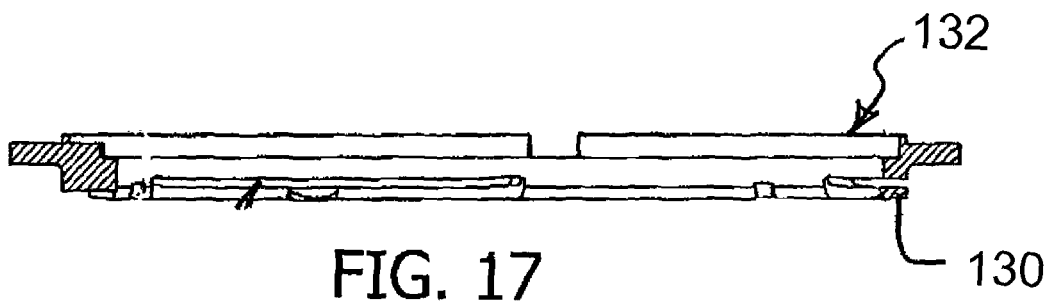
FIG. 17 is a section view taken along line 17-17 of FIG. 16.
Figure 23:
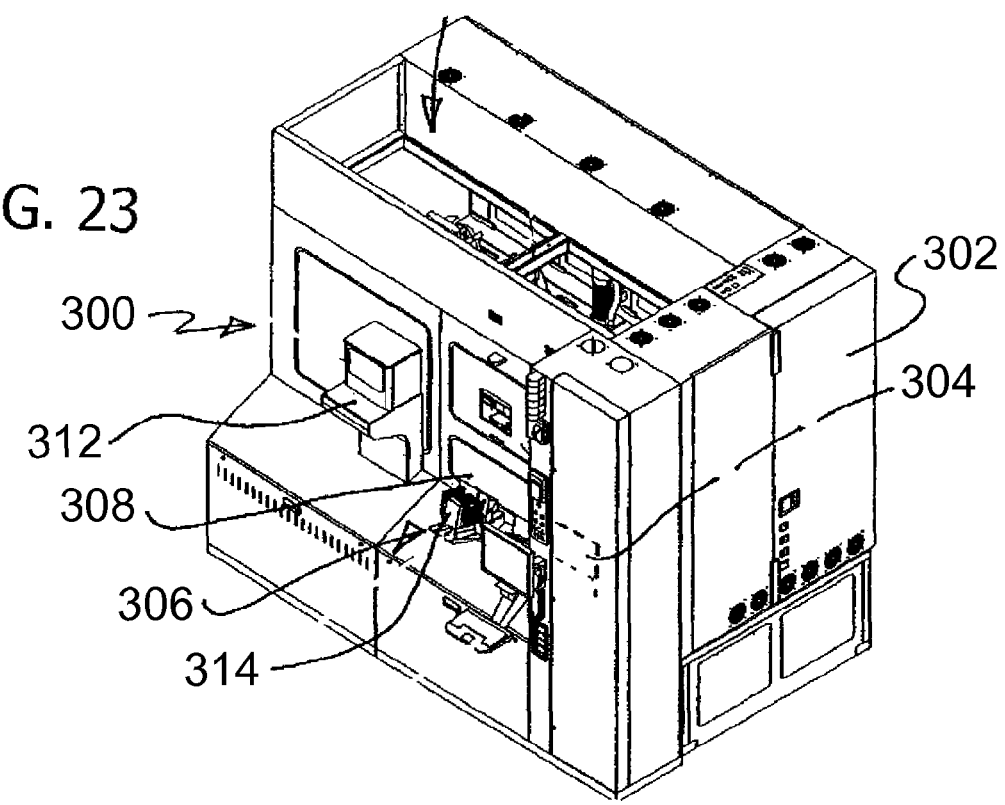
FIG. 23 is a perspective view of an automated processing system including the processor shown in FIG. 1-22.
Figure 24:
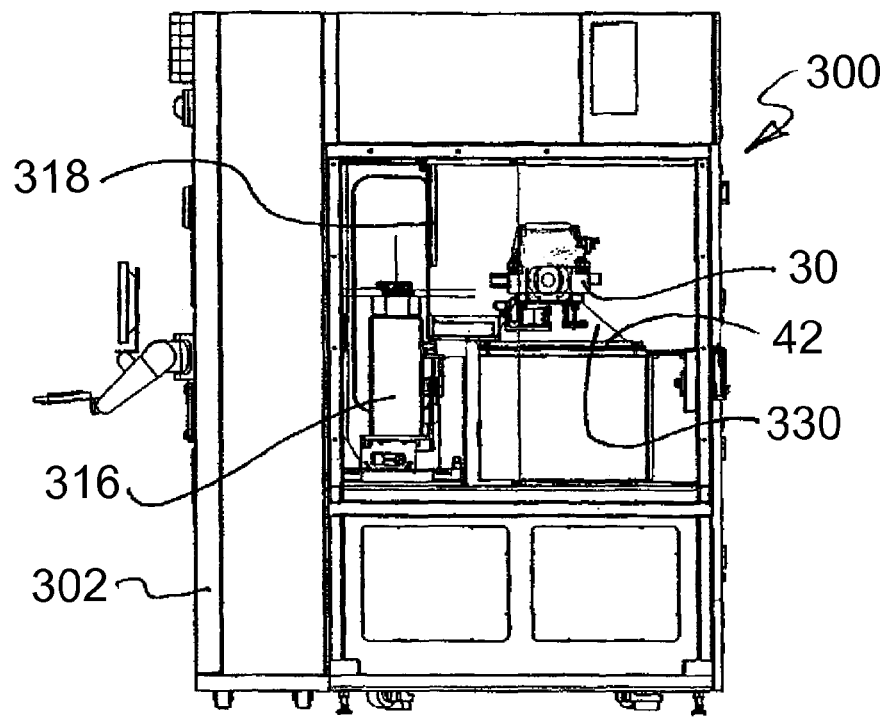
FIG. 24 is a side view of the system shown in FIG. 23.
Figure 25:
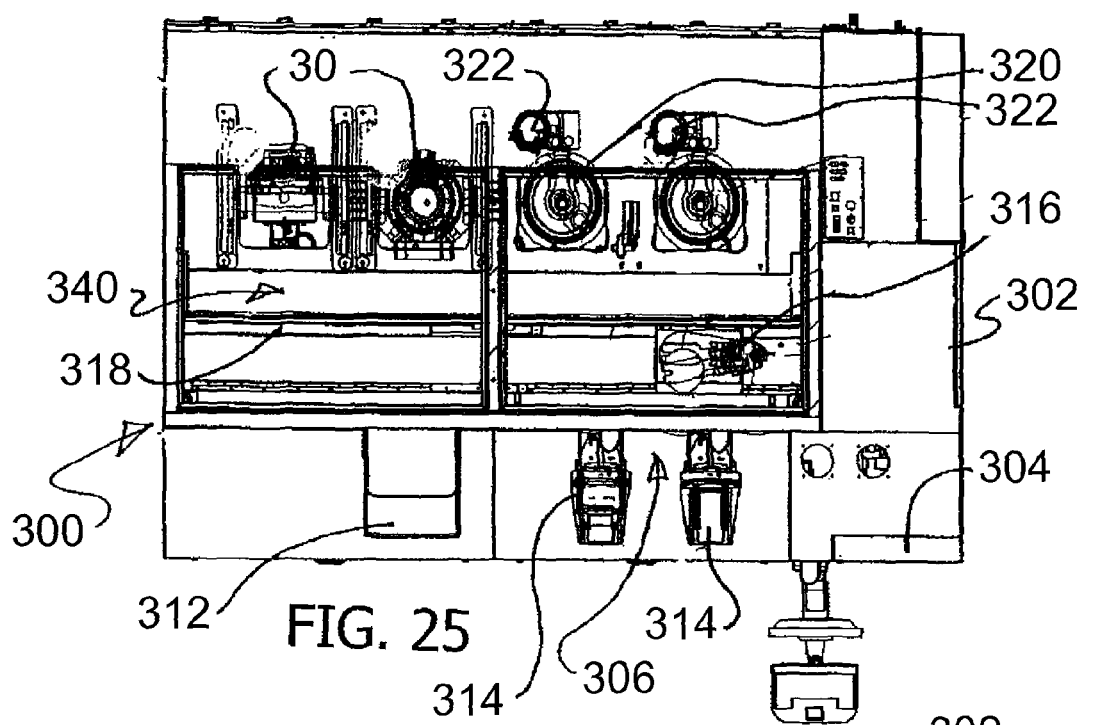
FIG. 25 is a top view of the system shown in FIG. 23.

Referring to FIGS. 14, 16 and 17, the upper seal clamp ring 132 has resilient ejector tabs 130 that press down slightly on the outer edge of the wafer, when the head seal 128 is engaged against the wafer 250. FIG. 14 shows in dotted lines the nominal position where the ejector tabs 130 would be with no wafer present. With a wafer 250 present, the bottom surface of ejector tabs rest on the top surface of the wafer, at the outer edge of the wafer. Referring to FIG. 14, the seal 128 and the upper seal clamp ring 132 are dimensioned so that as the movable electrode assembly 152 moves up away from the wafer 250, the seal 128 separates from the wafer first, while the ejector tabs 130 continue to hold the wafer down onto the base seal 210. This prevents any potential for having a wafer stick to the head seal 128 as the seal is lifted away from the wafer after processing.

As shown in FIG. 11, an electrolyte inlet fitting 220 leads into an inlet 224 in the base 32. As in the head 34, a diffuser plate or similar liquid diffusing element 126 may be attached over the inlet 224. With the base seal 210 in contact with a wafer 250, a lower or anode process chamber 240 is formed between the window 266 and the wafer 250, with the anode 264 near the bottom of lower process chamber 240. An electrolyte outlet 226 runs from the lower process chamber 240 to an electrolyte outlet fitting 222 on the base 32. A diffuser plate 126 may also be provided over the electrolyte outlet 226.

Although various materials may be used, the design shown uses electrodes 96 and 264 made from boron-doped silicon. The upper electrode 96 (the cathode) is about 25 mm thick. The diameter of the electrode 96 may be substantially the same as the diameter of the wafer 250. The diameter of the head and base seals 128 and 210 is typically 2-10 mm less than the wafer diameter, providing, for example, an edge exclusion zone (the outer annular area of the wafer protruding beyond the seal) from about 1-5 mm. The electrode surface may be diamond coated. If used, the diamond coating is doped to make it electrically conductive.

As the electrolyte generally will include concentrated hydrofluoric acid, the components of the processor 30 coming in contact with the electrolyte are made of materials, such as Teflon (fluorine resins) or PVDF, which are resistant to corrosion by HF or other reactive electrolyte chemicals. The cap screws or other fasteners in the processor 30 generally may be made of similar plastic or non-metal materials. Referring to FIGS. 12 and 13, the buss plate 98, electrode wire leads, and wire lead attaching screws are metal, as these components require high electrical conductivity. However, these may be the only metal components in the head 34. These metal components are sealed off from the electrolyte introduced into the process chambers 146 by the first seal 110, second seal 108, third seal 104, and the fourth seal 105.

With reference to FIG. 12, in the event of any leakage around the electrode 96, electrolyte would first collect in the groove 102, and be detected by the optical liquid detector 170. In addition, the seal vents 116 will tend to divert any leaking electrolyte away from the back of the electrode. Upon detection of a leak, the controller shuts down the processor 30, before any electrolyte can move past the fourth seal 105. In this way, the electrolyte is entirely isolated from any metal in the head 34. Turning to FIGS. 5, 8 and 11, the base 32 may be made without any metal components, as the base does not require any electrical elements. Consequently, there is little or no potential for metal contamination from the base 32. Metal contamination of the electrolyte or wafer, or inadvertent release of electrolyte into the head or base, is accordingly avoided.

In the anode assembly 44, the ring contact 265 and wire lead are sealed off from the process chamber 240 via the seals 267. Leak detectors 170 and seal vents 116 as used in the head 34 may similarly be provided in the anode assembly 44. As the window 266 of the anode assembly 44 forms the bottom end of the process chamber 240, the illumination module 46 is not exposed to electrolyte during normal operations. In the event of a leak from the process chamber, the containment chamber prevents electrolyte from contacting and corroding other areas of the processor.

The processor 30 provides highly uniform current flow through the process chambers 146 and 240, yet within a relatively small space. The clearance space around the processor 30, to allow it to rotate between horizontal and vertical positions, is also relatively small. Referring again to FIGS. 12 and 13, the electrode 96 shown has a diameter of about 150 mm and a thickness of about 25 mm. For this type of design, an electrode (or wafer) diameter to electrode thickness ratio of about 4-10:1 may be used. The height of the chambers (dimension CC in FIGS. 11 and 12) is also generally about the same as the electrode thickness in this example, with ratios of chamber height to electrode thickness ranging from about 2.5 to 1 to about 1 to 1 may be useful.

The height of the chamber 146, and/or the thickness of the electrode 96, can of course also exceed these ranges, although this may tend to make the head 34 larger, with no improvement in current uniformity. The diameter and height of the containment chamber 60 are not critical and may be selected to accommodate the size and/or shape of other internal processor components, within a compact space. Turning once again to FIG. 11, the bottom or anode process chamber 240 has a height DD which is about 2-5 or 3-4 times greater than the height CC of the top or cathode process chamber 146. The dimension DD is measured from the top surface of the window 266 to the wafer 250 (with the processor 30 in the closed or process position as shown in FIG. 11). The inner diameter of the anode designated IE in FIG. 11 is generally the same as, and concentric with, the diameter of the seal 210. To provide a compact processor 30 that still provides highly uniform current flow, the dimension DD is typically about 60-100% or 70-90% of the dimension IE. Dimension DD is larger than dimension CC to allow more tunnel length, which provides a more spatially uniform current flow across the wafer (since current flows from an annular anode rather than from a disk anode).

Typically, the containment chamber 60 may have a diameter of about 1.1 to 2 or 1.1 to 3 times the diameter of the seals 128 or 210 or the workpiece. The height of the containment chamber 60 may be from about %5-%50 of the diameter of the seals 128 or 210.

Operations of the processor 30 are generally controlled via an electronic controller, such as the controller 304 described below. In use, the processor 30 is initially loaded with a wafer 250. For loading (and unloading a wafer), the processor 30 is in the horizontal position as shown in on the right side of FIG. 2. The terms horizontal and vertical here refer to the orientation of the wafer 250 within the processor 30. The moveable electrode assembly 152 in the head 34 is in the up position, as shown in FIGS. 12 and 13. A wafer 250 is moved into the processor 30 through the load slot 56, typically by a robot. As the wafer moves into the processor, the edges of the wafer may contact the wafer guides 213 which protrude up from the base seal retainer 212. This properly centers and locates the wafer 250 relative to the seals 128 and 210. The wafer 250 is then released, with the wafer resting on the lower or base seal 210. The robot (or other wafer mover used) is withdrawn. The wafer 250 may be loaded with either the front side or the back side facing the lamp assembly 270 or other light source.

The controller, e.g., the electronic controller 304, opens valves causing water to be supplied under pressure to the lower cylinder port 158 shown in FIG. 12. This drives the cylinder 82 and the entire moveable electrode assembly 152 downwardly. The water is used only as a hydraulic fluid and does not come into contact with the electrolyte or wafer 250. Accordingly, water purity is not critical, so that standard tap water, under standard plumbing pressures, may be used. The moveable electrode assembly 152 continues to move down towards the wafer until it bottoms out on the hard stop provided by the shoulders 218 of guide pins 214. The lower position sensor 164 provides a signal to the controller confirming that the moveable electrode assembly is in the process position. The water pressure provided to the cylinder may optionally be regulated, although regulation is not necessary. The upper or head seal 128 is pressed into sealing contact with the top surface of the wafer 250. The base seal 210 is also in sealing contact with the wafer 250. The processor 30 is then in a closed position, as shown in FIGS. 11 and 14. Water pressure may be maintained during processing.

Referring now to the left side of FIG. 2, the controller actuates the rotate motor 38 driving a gear reducer 39, pivoting the entire processor 30 about 90 degrees, so that the wafer 250 is moved into a vertical orientation, with the slot 56 facing up and with the drain 58 facing down. The rotate motor 38, or an equivalent driving element, may be supported on a deck 42 or other supporting surface.

The controller then opens valves supplying electrolyte to the processor 30. Electrolyte flows into the upper and lower process chambers 146 and 240 through the inlets 148 and 224, and through the diffuser plates 126, as shown in FIGS. 11 and 12. Valves controlling flow through the return lines 142 and 226 may be opened to allow the chambers to vent while filling with electrolyte, or during other times, or at all times during the processing.

Electrical current is applied to the electrodes 96 and 264. Current flows from the cathode or first electrode, through the electrolyte in the chamber 240, through the wafer, and through the electrolyte in the chamber 146 to the anode 264, or other electrode. The wafer is sufficiently conductive to provide a bi-polar electrode function. Electrolyte may be continuously provided at a low flow rate, so that the electrolyte in the chambers 146 and 240 is constantly refreshed, although usually without substantial fluid turbulence.

Turning to FIGS. 11 and 20, the lamps 274 are turned on. Liquid coolant, such as water, is pumped through the coolant channel 279 in the lamp assembly. Liquid coolant is similarly pumped through the cooling channel ring in the reflector assembly 280. Light from the lamps 274 is focused by the lens 285, and is diffused by the diffuser 286. This creates a generally uniform beam shining on the bottom side of the wafer 250. The use of light and electrical current processes the silicon wafer 250 into porous silicon. Current flow across the wafer 250 may be monitored. As processing progresses, resistance often decreases, resulting in an increase in current flow. Voltage provided to the electrodes, and/or the intensity of the lighting, may accordingly be adjusted during processing.

During processing, the chambers 146 and 240 may be virtually entirely filled with electrolyte to provide more uniform processing. Gasses generated during processing may be carried off via the circulation of electrolyte through the chambers 146 and 240. Alternatively, separate gas exhaust ports may optionally be used in the chambers 146 and 240. The rotate motor 38 may optionally gently or even rapidly rock or oscillate the processor 30 at various times, to help to agitate the electrolyte, displace gas bubbles, provide mixing of other chemicals that may be used, or to help distribute rinsing liquid The process described produces amorphous porous silicon.

The electrolyte parameters, such as chemical composition, temperature, pressure, flow rate, concentration, etc., may be varied to achieve desired process results. Current flow may also be selected as desired. The current may be increased to a high enough level to transition from a porous silicon process to a wafer polishing process. The processor 30 may therefore be used for wafer polishing. The electrolyte may include water, relatively concentrated HF, and an alcohol, such as isopropyl alcohol. Processing continues until the wafer surface 250 is sufficiently etched and becomes porous silicon. The lamps 274 and the electrical current to the electrodes 96 and 264 is turned off. The electrolyte is drained from the chambers. The chambers and workpiece may then be rinsed by filling the chambers with a rinse liquid, such as de-ionized water, and then draining the rinse liquid. A gas, such as heated nitrogen, may optionally be provided into the processor for drying the wafer. The rotate motor 38 is actuated in the reverse direction, to pivot the processor 30 back into the horizontal position shown on the right side in FIG. 2.

The controller then supplies water pressure to the cylinder 82 in the reverse direction, to lift the moveable electrode assembly 152 up and away from the wafer 250. As shown in FIG. 14, the ejector tabs 130 on the upper seal clamp ring 132 hold the wafer 250 down onto the base seal 210 until the head seal 128 is separated from the wafer 250. This prevents the wafer 250 from inadvertently sticking to the head seal 128. The wafer is then removed from the processor 30, again, typically via a robot grasping the edges of the wafer 250 from above, and withdrawing the wafer out of the processor 30 through the load slot 56. The processor 30 is then ready to process a subsequent wafer 250.

In some applications, the processor may operate with the chambers filled with electrolyte or other process liquid, but with no electrical current provided, or with no light provided, or without both. Since the processor is well designed to operate with highly reactive or corrosive electrolyte, it can also operate with other reactive or corrosive process liquids, including HF, without use of electricity or lighting. This provides a purely chemical process, rather than an electro-photo-chemical process. The processor 30 may also be configured to provide photo-chemical processing, by exposing the wafer or workpiece to light and process chemical liquids, without any electrical current flow provided. The lamps 274 in this instance may be UV lamps.

Since the chambers 128 and 240 are sealed off from each other, different process liquids may be provided into each chamber, simultaneously or sequentially. Consequently, the front or device side of the wafer and the back side of the wafer may simultaneously be processed using different process liquids and/or gases. With this type of processing, the process liquids may optionally be introduced into the chambers 128 and 240 with the wafer in a horizontal orientation, or in a vertical orientation. If the processor 30 is intended for non-electrical processing, the electrodes 96 and 264 may be omitted. In addition, the seals 128 and 210 may be designed to seal directly against each other, without contacting the wafer at all, and with the wafer supported within, rather than on, the lower seal 210.

Some wafers may be provided with a mask to determine which areas of the wafer are made porous. After electro-chemical processing, electrical current may be turned off, additional chemical processing steps may be performed, with or without changes to the electrolyte, to etch off the mask, or another layer or film on the wafer.

Referring to FIG. 11, during processing the electrolyte is sealed within the upper and lower process chambers 146 and 240. These process chambers are surrounded by the containment chamber 60, which is open at one side at the load slot 56, and at the opposite side at the containment drain 58. However, there is no other fluid pathway out of the containment chamber 60. The bellows 120 seals the upper electrode ring 106 to the cover 70. Accordingly, a rinse liquid, such as water, may be provided into the containment chamber 60 via the load slot 56, to rinse all exposed surfaces within the containment chamber 60. The containment chamber itself may also be provided with rinse nozzles connected to a rinse liquid source for rinsing the containment chamber 60.

The rinse liquid may be provided between wafer processing, while the processor is open and the seals 128 and 210 are completely exposed. This allows virtually all surfaces of the seals to be rinsed, removing any trapped or adhering electrolyte. Rinsing can advantageously be performed with the processor 30 once again rotated into the vertical orientation, with the rinse liquid flowing via gravity through the containment chamber 60 and draining out of the containment drain 58. Rinsing with the chamber open allows the processor to maintain uniform process start up conditions, since a complete rinse of all surfaces contacted by electrolyte (or other process chemicals) may be achieved between each process cycle.

The substantially non-conductive rinse liquid may also optionally be flowed through the containment chamber 60 while the processor is closed, during actual processing of a wafer. Since the electrolyte is sealed within the process chambers 146 and 240, the rinse liquid does not come into contact with the electrolyte, and the rinse liquid only contacts the outer seal surfaces and the annular edge of the wafer extending radially outwardly beyond the seals 128 and 210 (typically by about 2-6 mm). Since the electrolyte is an electrical conductor, any leaking electrolyte may alter the otherwise uniform conduction path provided by the processor 30. This can cause non-uniform processing. Running rinse liquid through the containment chamber during processing will remove any leaking electrolyte, thereby maintaining the uniform conduction path necessary for providing high quality porous silicon.

The rinse liquid may also be provided into or through the containment chamber upon detection of an electrolyte leak or other fault condition, to carry away any leaking or exposed electrolyte. One example of a containment chamber rinse system is described below in connection with an automated processing system.

As shown in FIGS. 23-26, the processor 30 may be used in an automated processing system 300. Various types of automated systems may be used, including varying numbers of processors 30, arranged in whichever way (e.g., linear array, arcuate array, vertically stacked, etc.) may be preferred. In the automated system 300 shown in FIGS. 23-26, two processors 30 and two spin rinse dryers 322 are provided within an enclosure 302. A load window 308 is provided at a load/unload station 306, at the front of the enclosure 302. Air inlets 310 are located on the top of the enclosure 302. A robot 316 moves along a lateral rail, to transfer wafers 250 from the load station 306 into or out of the processors 30 or spin rinse dryers 320. An isolation wall 318 may be provided between the processors 30 and the robot 316, to reduce exposure of the robot 316 to process chemicals used in the processors 30. An opening is provided in the isolation wall 318, to allow an end effector of the robot 316 to reach into the processors 30. A wafer transfer zone or area 340 may be provided between the isolation wall 318 and the processors 30.

When a wafer is moved between processors 30 and 320, the wafer may remain within the transfer zone 340 as the robot 316 carries the wafer parallel to the isolation wall 318. Any residual process liquids that may be on the wafer may therefore come into contact only with the end effector, but not with the rest of the robot 316. A controller 304 controls movement and operation of the robot 316, processors 30, spin rinse dryers 320, as well as various other components within the system 300 (e.g., pumps, valves, actuators, displays, interlocks, communications, etc.), as is well known in the semiconductor field. The deck 324, isolation wall 318, enclosure 302, and other components of the system 300 may advantageously be made of plastic materials, to better avoid contamination and corrosion.

In use, wafers 250 are delivered to the load station 306, typically within a cassette, box, or carrier 314. The load window 308 opens. The robot 316 picks up a wafer 250 at the load station 306 and moves the wafer 250 into one of the processors 30. The wafer may optionally be first moved into a pre-aligner 312, or other chamber for a pre-processing step. The wafer 250 is processed within the processor 30, as described above. In the interim, the robot 316 may return to the load station 306 to repeat the load sequence and load another wafer into the second processor 30. Upon completion of processing, each wafer 250 may be moved by the robot 316 into one of the spin rinse dryers 320. The spin rinse dryers 320 shown have lift/rotate apparatus 322 used to lift and rotate the head of the spin rinse dryer 322 into a load/unload position. Various types of spin rinse dryers (or other types of additional chambers or processors, e.g., metrology, anneal, etc.), with or without lift/rotate apparatus, may be equivalently used. After each wafer 250 is rinsed and dried, the robot 316 moves the wafer back to the load station 306, where the wafer is typically placed back into the same cassette 314, or into a different cassette.

The processor 30 itself may also perform rinsing and drying, as a stand alone unit or within a processing system. After an optional line purging step, rinsing may be performed by flowing a rinse liquid, such as de-ionized water, through the process chambers 146 and 240, typically with the wafer and the chamber in the vertical position. The rinse liquid may then be relatively slowly drained out, to perform a slow extraction type of drying process. In many applications, this process will leave the wafer sufficiently dry for subsequent handling or processing, even if some droplets of rinse liquid remain on the wafer. In an alternative drying process, a surface tension/meniscus drying step may be used after rinsing the wafer. In this alternative process, a drying fluid, such as isopropyl alcohol, can be provided into the process chambers during the drying step.

Figure 26:
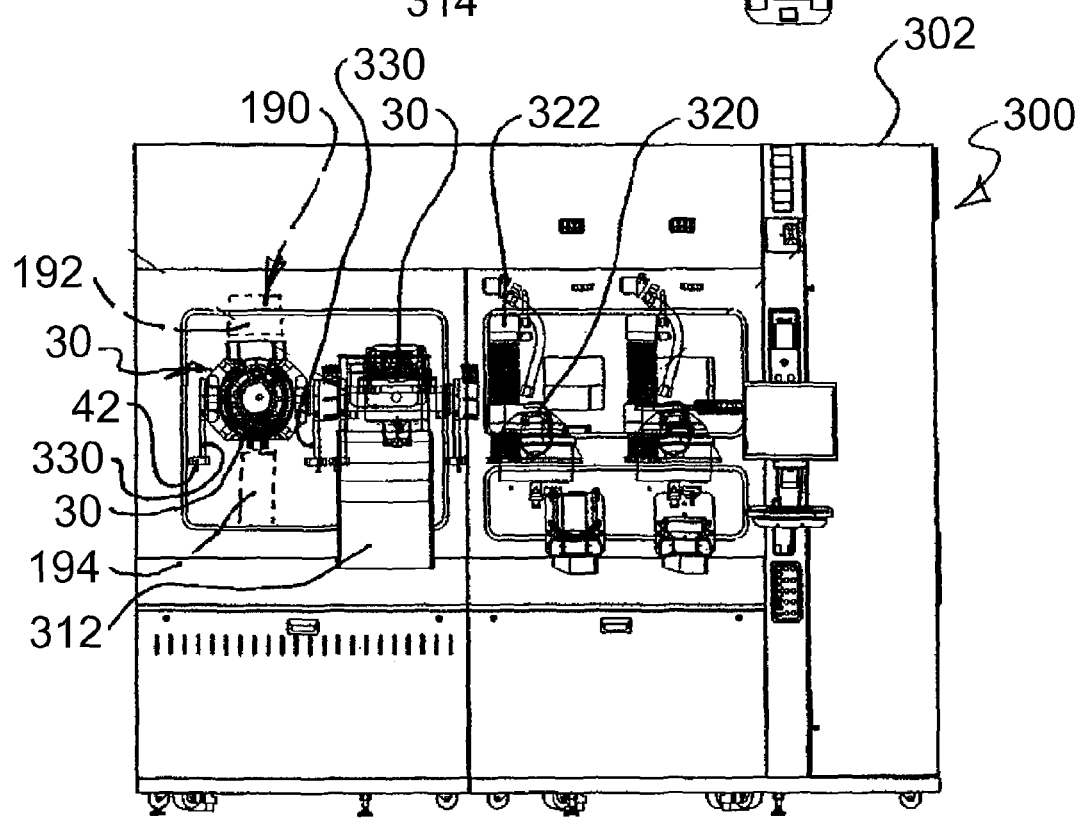
FIG. 26 is a front view of the system shown in FIG. 23.

Referring to FIG. 26, the system 300 may optionally include an isolation chamber rinse system 190. If used, the rinse system 190 may include a rinse water channel or array of spray nozzles 192 aligned with and adjacent to the load slot frame 62 of the processor 30, when the processor is rotated into the vertical position. Similarly, an isolation drain collection pipe 194 may be provided in the system 300, adjacent to and aligned with the isolation drain 58, when the processor 30 is in the vertical position. Adequate clearance is provided between the processor 30 and the channel 192 and collection pipe 194, so that the processor 30 can freely pivot between the vertical and horizontal positions. The isolation drain 58 may optionally be connected to a drain/exhaust line, such as the collection pipe 194, via a flexible tube, which can accommodate the vertical to horizontal movement of the processor 30, to help insure that no liquid or vapors draining from the processor 30 are released into the system 300.

The isolation chamber which is generally shown at 60 in FIG. 11, may be rinsed by moving the processor 30 into the vertical position, and then providing rinse water from the overhead array of spray nozzles 192 through the load slot 56 into the processor 30. The rinse water drains out of the processor 30 through the isolation drain 58, and into the collection pipe 194 shown in FIG. 26. The collection pipe 194 connects to a system or facility drain. The isolation chamber rinse system 190 may be used to provide routine rinsing of the isolation chamber 60, during wafer processing, between wafer processing, or periodically, after processing a preselected number of wafers. The isolation chamber rinse system 190 may also be used if a fault condition is detected indicating a potential leak of electrolyte. In this condition, the isolation chamber 60 can be rapidly flooded with rinse water, to reduce any leakage of electrolyte (liquid or vapors) into the system 300. The processor may optionally be made and used without any isolation chamber 60. The anode assembly 44, or even just the anode ring 264, may be used in a processor having no light source. In this non-illuminated design, nozzles may be positioned to spray a fluid through the central open area of the anode ring 264 and onto the wafer, e.g., for rinsing. In this design, the illumination module 46 may be replaced with a nozzle or spray module 46.

Although wafer loading/unloading with the wafer in a horizontal position is more commonly used in many types of existing wafer handling equipment, the processor 30, or the automated system 300, may also be adapted to operate with wafer loading/unloading in a vertical orientation. Terms used here, including in the claims, such as upper and lower, above and below, etc. are intended for explanation and not requirements that one element be above or below another element. Indeed, the processor 30 may be operated upside down. While porous silicon has been described above, the processor 30 may also be used for processing similar materials, including gallium compounds. The terms vertical and horizontal here include positions within 5, 10 or 15 degrees of vertical or horizontal, respectively. The processor 30 may also be used in a fixed position. For example, the processor 30 may be used without any rotate motor 38. In this design, the processor 30 may be supported in a fixed horizontal position, or in a fixed vertical position, or at an angle between horizontal and vertical.

Figure 27:
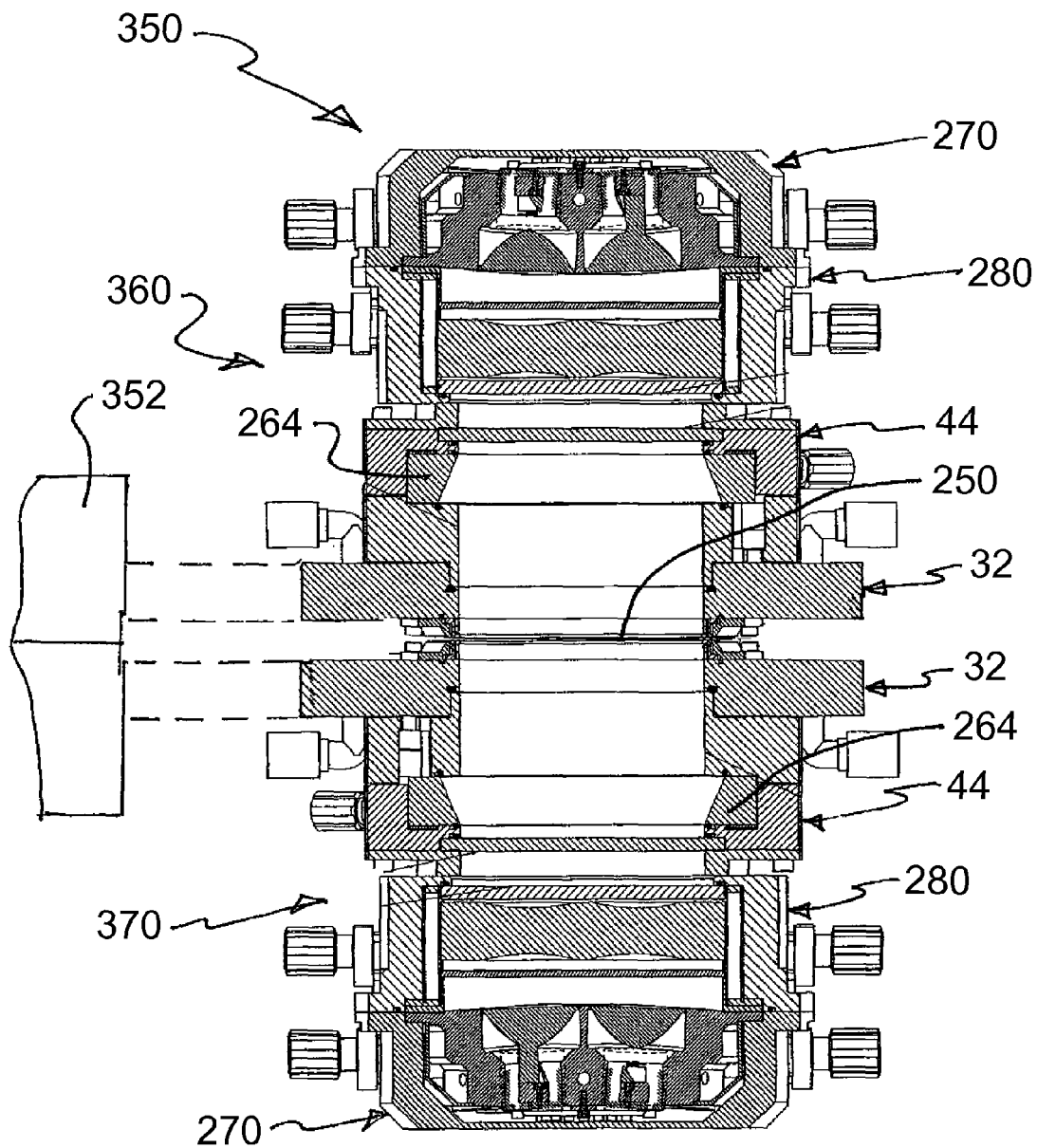
FIG. 27 is a section view of an alternative embodiment.

As shown in FIG. 27, an alternative processor design 350 may have an anode assembly 44, a reflector assembly 280, and a lamp assembly on both sides of the wafer 250. In this design, both sides of the wafer may be simultaneously illuminated. One electrode ring 264 may be made the anode and the other electrode ring may be made the cathode. The combination of the base 32, anode assembly 44, the reflector/lens assembly 280, and the lamp assembly 220 above and below the wafer 250, form first and second light tunnel electrode units 360 and 370. An actuator 352 moves one or both of the light tunnel electrode units, to make and break the seal with the wafer 250.

Various changes and substitutions may of course be made without departing from the spirit and scope of the invention. The invention, therefore, should not be limited, except by the following claims and their equivalents.

The invention claimed is:

1. A processor comprising:
    a housing;
    a first seal in the housing;
    a first electrode in the housing;
    a second seal in the housing moveable relative to the first seal;
    a second electrode having a polarity different from the first electrode; and
    one or more lamps positioned to shine light through an open central area of the first electrode, towards a workpiece between the first and second seals.

2. The processor of claim 1 further comprising a motor linked to the housing for pivoting the housing.

3. The processor of claim 1 wherein the housing comprises a head attached to a base, and with second electrode and the second seal in the head, and with the first seal and the first electrode attached to the base.

4. The processor of claim 1 with the first electrode having an annular shape.

5. The processor of claim 3 with the second seal and the second electrode forming a moveable electrode assembly, and further including an actuator in the head attached to the moveable electrode assembly.

6. The processor of claim 5 further comprising a lens and a diffuser between the lamps and the first seal.

7. The processor of claim 4 with the first electrode having an angled inside facing surface.

8. The processor of claim 4 with the first electrode spaced apart from the first seal by a dimension less than the diameter of the first electrode.

9. The processor of claim 1 with the housing including a base and a head, and with the second seal and the second electrode in the head and the first seal and the first electrode in the base, and further including a plurality of locating pins in the base around an outside perimeter of the first seal, with an upper section of substantially each of the locating pins within a bore in the head, for maintaining the head in alignment with the base.

10. A porous silicon processor comprising:
    a process chamber having a first seal spaced apart from a first electrode, and a second seal spaced apart from a second electrode, and with the second seal and the second electrode on a moveable electrode assembly;
    a containment chamber substantially enclosing the process chamber, with a loading opening and a drain/exhaust opening connecting into the containment chamber; and
    a light source positioned to project light onto a wafer supported on the first seal.

11. The processor of claim 10 further comprising a motor linked to the containment chamber for pivoting the containment chamber, and the process chamber in the containment chamber, into loading and processing positions.

12. The processor of claim 10 with the first electrode spaced apart from the first seal by a dimension 150% to 400% greater than the spacing between the second electrode and the second seal.

13. Apparatus, comprising:
    a head having a moveable electrode assembly including a head electrode and a head seal substantially concentric with the head electrode, with the head seal spaced apart from the head electrode, and with the head seal and the head electrode forming a head process chamber with a second side of a wafer;
    a head fluid inlet and a head fluid outlet in the electrode assembly connecting into the head process chamber;
    a base having a base seal;
    a base electrode supported on the base and substantially concentric with the base seal;
    a window on the base, with the base, the base seal, the base electrode, and the window forming a base process chamber with a first side of the wafer;
    a base fluid inlet and a base fluid outlet in the base; and
    a light source projecting light through the window onto the first side of the wafer.

14. The processor of claim 13 with the base electrode having an open central area and with the light source projecting light through the open central area of the base electrode.

15. A processor comprising:
    a workpiece support;
    a first process chamber on a first side of the support;
    a second process chamber on a second side of the support, opposite to the first side;
    process fluid supply means for supplying process fluid into the first and second process chambers;
    seal means for sealing the first process chamber from the second process chamber;
    electrical current means for passing electrical current through a process fluid in the first process chamber, a workpiece, and process fluid in the second process chamber, respectively; and
    lighting means for illuminating the workpiece.

16. The processor of claim 15 further comprising means for pivoting the process chambers between a load position and a process position.

17. The processor of claim 15 with the workpiece support comprising a seal.

18. A processor comprising:
    a housing;
    a first seal in the housing;
    a first electrode in the housing having a first open central area;
    a second seal in the housing moveable relative to the first seal;
    a second electrode in the housing having second open central area;
    one or more first lamps positioned to shine light through the first open central area of the first electrode towards the first seal; and
    one or more second lamps positioned to shine light through the second open central area of the second electrode towards the second seal.

* * * * *